(12) United States Patent  (10) Patent No.: US 9,011,729 B2
Nakamura et al.  (45) Date of Patent: Apr. 21, 2015

(54) ORGANIC THIN-FILM TRANSISTOR

(75) Inventors: Hiroaki Nakamura, Sodegaura (JP);
Masatoshi Saito, Sodegaura (JP);
Hirofumi Kondo, Sodegaura (JP); Toru Bando, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 275 days.

(21) Appl. No.: 13/642,722

(22) PCT Filed: Apr. 21, 2011

(86) PCT No.: PCT/JP2011/002332
§ 371 (c)(1),
(2), (4) Date: Oct. 22, 2012

(87) PCT Pub. No.: WO2011/132425
PCT Pub. Date: Oct. 27, 2011

(65) Prior Publication Data
US 2013/0037809 A1 Feb. 14, 2013

(30) Foreign Application Priority Data
Apr. 22, 2010 (JP) ................ 2010-098475

(51) Int. Cl.
*H01B 1/00* (2006.01)
*H01L 51/54* (2006.01)
*H01L 51/10* (2006.01)
*H01L 51/05* (2006.01)

(52) U.S. Cl.
CPC ........... *H01L 51/102* (2013.01); *H01L 51/0541* (2013.01); *H01L 51/0545* (2013.01); *H01L 51/105* (2013.01)

(58) Field of Classification Search
CPC ...... H01B 1/128; C09D 165/00; H01L 21/28; H01L 29/417; H01L 29/786; H01L 51/0035
USPC ............. 252/500; 257/40, E51.001, E51.006; 438/99
See application file for complete search history.

(56) References Cited

U.S. PATENT DOCUMENTS 5,232,631 A  8/1993 Cao et al.
5,574,291 A  11/1996 Dodabalapur et al.
(Continued)

FOREIGN PATENT DOCUMENTS

JP  5-055568  3/1993
JP  8-228034  9/1996
(Continued)

OTHER PUBLICATIONS

International Search Report PCT/JP2011/002332 dated Aug. 2, 2011.
(Continued)

*Primary Examiner* — Mark Kopec
(74) *Attorney, Agent, or Firm* — Foley & Lardner LLP

(57) ABSTRACT

An organic thin film transistor including at least a gate electrode, a source electrode, a drain electrode, an insulator layer and an organic semiconductor layer, at least one of the source electrode and the drain electrode including a conductive polyaniline composition containing (a) a substituted or unsubstituted polyaniline composite which is protonated by an organic protonic acid or its salts represented by $M(XCR^4(CR^5_2COOR^6)COOR^7)_p$ and (b) compound having a phenolic hydroxyl group.

10 Claims, 4 Drawing Sheets

(56) References Cited

U.S. PATENT DOCUMENTS

| | | | |
|---|---|---|---|
| 5,596,208 A | 1/1997 | Dodabalapur et al. | |
| 5,624,605 A | 4/1997 | Cao et al. | |
| 5,626,795 A | 5/1997 | Smith et al. | |
| 5,705,888 A | 1/1998 | Staring et al. | |
| 5,968,416 A | 10/1999 | Smith et al. | |
| 5,986,400 A | 11/1999 | Staring et al. | |
| 6,107,117 A | 8/2000 | Bao et al. | |
| 6,278,127 B1 | 8/2001 | Dodabalapur et al. | |
| 6,326,640 B1 | 12/2001 | Shi et al. | |
| 6,992,324 B2 | 1/2006 | Nagayama | |
| 7,038,237 B2 | 5/2006 | Nagayama | |
| 7,372,070 B2 | 5/2008 | Yatsunami et al. | |
| 8,030,125 B2 | 10/2011 | Kasahara | |
| 8,535,812 B2 * | 9/2013 | Totsuka et al. | 428/523 |
| 2007/0108420 A1 * | 5/2007 | Kuramoto | 252/500 |
| 2011/0309366 A1 | 12/2011 | Kasahara | |

FOREIGN PATENT DOCUMENTS

| | | |
|---|---|---|
| JP | 8-228035 | 9/1996 |
| JP | 9-232589 | 9/1997 |
| JP | 10-125924 | 5/1998 |
| JP | 10-190001 A | 7/1998 |
| JP | 2001-094107 | 4/2001 |
| JP | 2001-506393 A | 5/2001 |
| JP | 338456 B2 | 3/2003 |
| JP | 2004-055652 A | 2/2004 |
| JP | 2005-327797 A | 11/2005 |
| JP | 2006-156752 | 6/2006 |
| JP | 2008-097988 | 4/2008 |
| JP | 2008-243582 A | 10/2008 |
| JP | 2009-120762 | 6/2009 |
| WO | WO2005/052058 * | 6/2005 |
| WO | WO 2005/052085 A1 | 6/2005 |
| WO | WO2009/034816 * | 3/2009 |
| WO | WO 2009/084419 A1 | 7/2009 |

OTHER PUBLICATIONS

International Preliminary Report on Patentability PCT/JP2011/002332 dated Nov. 6, 2012.

Marcia M. Payne et al., "Organic Field-Effect Transistors from Solution-Deposited Functionalized Acenes with Mobilities as High as 1 $cm^2/V\bullet s$", J. Am. Chem. Soc., 2005, 127, pp. 4986-4987.

Tatsuya Shimoda et al., "Organic Transistor Fabricated by Ink-Jet Printing", Oyo Buturi (Journal of Applied Physics), vol. 70, No. 12, 2001, pp. 1452-1456.

\* cited by examiner

ORGANIC THIN-FILM TRANSISTOR

TECHNICAL FIELD

The invention relates to an organic thin film transistor. More particularly, the invention relates to an organic thin film transistor in which at least one of the source electrode and the drain electrode comprises a specific conductive polymer.

BACKGROUND ART

A thin film transistor (TFT) has been widely used as a switching device for a display such as a liquid crystal display device or the like. A representative TFT has a configuration in which a gate electrode, an insulator layer and a semiconductor layer are stacked in this sequence on a substrate, and has, on the semiconductor layer, a source electrode and a drain electrode being formed with a predetermined interval therebetween. The semiconductor layer constitutes a channel part, and an on-off operation is conducted by controlling electric current flowing between the source electrode and the drain electrode by a voltage applied to the gate electrode.

Conventionally, the semiconductor layer of such a TFT was fabricated by using amorphous or polycrystalline silicon. However, a CVD apparatus used for fabrication of a TFT using silicon is very expensive, and an increase in size of a display or the like using a TFT had a problem that the production cost increased significantly. Further, there was a problem that, since forming amorphous or polycrystalline silicon into a film is conducted at significantly high temperatures, the type of a material which is usable as a substrate is limited, and hence, a lightweight resin substrate or the like could not be used.

In order to solve the problem, a TFT using an organic substance (hereinafter often abbreviated as an organic TFT) instead of amorphous or polycrystalline silicon has been proposed. As the film-forming method which is used when a TFT is fabricated by using an organic substance, a vacuum vapor deposition method, a coating method or the like are known. According to these methods, it is possible to realize an increase in size of a device while suppressing an increase in the production cost, and is also possible to allow the process temperature which is required during film formation to be relatively low. Accordingly, such an organic TFT has advantages that only small restrictions are imposed on the type of materials used for a substrate. Therefore, its practical use has been promising and research reports have been actively found.

A practical TFT is required to have a high carrier mobility, a large current on/off ratio and excellent storage stability. Meanwhile, the on-off ratio as referred to herein means a value which is obtained by dividing a current which flows between source and drain electrodes when a gate voltage is applied (ON) by a current which flows between source and drain electrodes when a gate voltage is not applied (OFF). The on current is normally means a current value at the time when the current flowing between source and drain electrodes is saturated (saturation current) after increasing the gate voltage.

As the organic substance used in an organic semiconductor layer of a TFT, as for a p-type organic TFT, polymers such as conjugated polymers and thiophene-based oligomers (Patent Documents 1 to 5 or the like), fused aromatic hydrocarbons such as pentacene (Patent Documents 6 and 7 or the like) and the like are used singly or in a mixture with other compounds.

However, these organic TFTs have a problem that the contact resistance between the source electrode and the organic semiconductor and/or between the drain electrode and the organic semiconductor is high, and hence, they require a high driving voltage. Further, there is a disadvantage that the too large contact resistance results in a low field effect mobility and a low on/off ratio.

In general, in an organic TFT, carriers are injected from a source electrode by the application of gate voltage, and a channel is formed in an organic semiconductor. By applying a voltage (drain voltage) between the source electrode and the drain electrode, current (drain current) is flown between the source electrode and the drain electrode. By the gate voltage, the amount of carriers injected changes, whereby the drain current can be controlled. Quantitatively, the drain current can be expressed by the following formulas (1) and (2). The formula (1) is satisfied in a linear region in which the drain voltage is small, and the formula (2) is satisfied in a saturation region in which the drain voltage is large.

$$I_D = \frac{W\mu C}{L} V_D \left[(V_G - V_{th}) - \frac{1}{2} V_D\right] \quad (1)$$

$$I_D = \frac{W\mu C}{L} \frac{(V_G - V_{th})^2}{2} \quad (2)$$

wherein $I_D$: drain current, $V_D$: drain voltage, $V_G$: gate voltage, $V_{th}$: threshold voltage, $\mu$: field effect mobility, C: capacity of an insulator per unit area, L: channel length, and W: channel width.

In the above formula, if the organic semiconductor is in the ideal state, that is, in the state where the source electrode and the drain electrode are in Ohmic contact and no carrier injection barriers are present, the field effect mobility $\mu$ will be close to the value which is inherent to a material. However, in general, contact resistance is generated between the organic semiconductor and the metal electrode. In the region where the drain voltage is small, the relationship between the current and the voltage is deviated from the relationship shown by the formula (1), and hence, the switching characteristics in this region are not good. Further, the voltage drops in the interface between the metal and the organic semiconductor, and an effective voltage applied to the organic semiconductor is decreased in an amount corresponding to the dropped voltage. As a result, the field effect mobility $\mu$ in the formulas (1) and (2) is calculated in a smaller value, causing problems such as lowering of the response speed or the on/off ratio, an increase in driving voltage or the like. Injection of carriers as referred to herein means, in the case of a p-type organic TFT, injection of holes from the electrode to the HOMO level, and in the case of an n-type organic TFT, injection of electrons from the electrode to the LUMO level. If contact resistance is generated from the injection barrier, in order to decrease the resistance as much as possible, in a p-type organic TFT, a metal having a large work function is used as the source electrode and the drain electrode in an attempt to decrease the injection barrier of holes. In many cases, Au (work function: 5.1 eV, page 493, Kagaku Bin ran II, (Handbook of Chemistry) Revised edition 3, published by Maruzen Publishing Co., Ltd. on 1983) is used. However, the HOMO level of many organic semiconductors which exhibit excellent performance as the organic TFT is larger than that of Au, and even though Au is used, contact resistance is generated due to the presence of the injection barrier, and as a result, as mentioned above, problems such as an increase in driving voltage, lowering of mobility, decrease in on/off ratio or the like arise.

In order to solve this problem, Patent Document 8 discloses that the source electrode and the drain electrode respectively contain a carrier relay film and a carrier conductive film, and a metal which constitutes the carrier relay film which is in contact with the organic semiconductor has a work function which is close to the ionizing potential of the organic semiconductor. Further, Patent Document 9 discloses an organic thin film transistor in which a charge injecting layer formed of an inorganic substance is interposed between the source electrode and the drain electrode and the organic semiconductor film. However, by using these disclosed materials, although a slight decrease in driving voltage is possible, a transistor has performance which is still insufficient for practical use.

On the other hand, an attempt has been made to produce an electrode easily by using a conductive polymer. Non-Patent Document 2 discloses an organic TFT in which the source electrode and the drain electrode are formed by the ink jet method by using PEDOT:PSS. This document also states that contact resistance is generated between these electrodes and the polymer F8T2 used as the organic semiconductor. PEDOT:PSS still has a problem for use as the source electrode and the drain electrode. Further, as a conductive polymer which has advantages such as being stable in the air, in Patent Document 10, as an electrode material which injects holes to an active layer, the following is disclosed as an example of using polyaniline (PANI) which is a compound similar to that used in the invention. That is, Patent Document 10 discloses an organic EL device in which a 200 nm-thick coating film of polyaniline having a specific conductivity of 50 S/cm and an area resistance of 1 k$\Omega$/□ is formed on a substrate. However, this document states only the conductivity, and does not state which materials are excellent as the electrode. In addition, Patent Document 11 discloses an organic TFT which can select polyaniline as the gate electrode or the source electrode. As example of such electrode, polyaniline derivatives are given. However, no specific statement is made as to which material of these polyaniline derivatives can improve the device properties. As the patent in which polyaniline is used as an electrode, Patent Document 12 can be given. In Example 3 of this patent, conductivities of pellets obtained by compressing polyaniline which is protonated by using various protonic acids such as dioctyl sulfosuccinate are shown in Table 1. Example 54 and after disclose an organic light-emitting diode (organic EL) using polyaniline in which CSA ((±)-10-camphorsulfonic acid) is used as a dopant is used as a hole-injecting electrode (anode). In this Example 54, there is a statement that current flowing a device using a conductive polyaniline transparent film as the hole-injecting contact is almost the same as that flowing a device fabricated using ITO as the hole-injecting contact. No improvement for hole-injecting properties relating to a lowering in driving voltage has been made.

RELATED ART DOCUMENTS

Patent Documents

Patent Document 1: JP-A-H8-228034
Patent Document 2: JP-A-H8-228035
Patent Document 3: JP-A-H9-232589
Patent Document 4: JP-A-H10-125924
Patent Document 5: JP-A-H10-190001
Patent Document 6: JP-A-H5-55568
Patent Document 7: JP-A-2001-94107
Patent Document 8: JP-A-2004-55652
Patent Document 9: JP-A-2005-327797
Patent Document 10: JP-T-2001-506393
Patent Document 11: JP-A-2008-243582
Patent Document 12: Japanese Patent No. 3384566

Non-Patent Documents

Non-Patent Document 1: Marcia M. Payne et al., J. Am. Chem. Soc., vol. 127, page 4986, 2005
Non-Patent Document 2: Tatsuya Shimoda and Takeo Kawase, Oyo Butsuri (Journal of Applied Physics), Vol. 70, No. 12, page 1452, 2001.

SUMMARY OF THE INVENTION

The invention has been made in order to solve the above-mentioned subject, and an object of the invention is to provide an organic thin film transistor which can be driven at a low driving voltage and has a high response (driving) speed.

As a result of extensive studies made in order to attain the above-mentioned object, the inventors have found that the above-mentioned object can be achieved by providing a film comprising a specific polyaniline composition (conductive polyaniline film) in contact with a semiconductor layer of an organic thin film transistor (organic TFT), by allowing the film to be at least a source electrode or a drain electrode, and by injecting holes from this layer comprising a conductive polyaniline composition (that is, the source electrode and/or the drain electrode).

The above-mentioned specific conductive polyaniline film in the organic thin film transistor of the invention is a layer comprising (a) a substituted or unsubstituted polyaniline composite which has been protonated with a specific organic protonic acid or its salts and (b) a compound containing a phenolic hydroxyl group.

The above-mentioned specific conductive polyaniline composition used in the invention is a composition disclosed in WO2005/052058. Its organic solvent phase can be uniformly applied to a substrate. A shaped body (film) of the conductive polyaniline obtained by applying a composition in which a compound having a small amount of a phenolic hydroxyl group is added to a substrate such as glass has significantly improved electric characteristics such as conductivity. The inventors made further extensive studies, and as a result, they have found that, by using a film formed of the polyaniline composition as at least a source electrode or a drain electrode of an organic thin film transistor, the driving voltage of an organic thin film transistor is lowered in a degree larger than that expected from the good conductivity thereof, thus leading to the completion of the invention.

According to the invention, the following organic thin film transistor is provided.
1. An organic thin film transistor comprising at least a gate electrode, a source electrode, a drain electrode, an insulator layer and an organic semiconductor layer, at least one of the source electrode and the drain electrode comprising a conductive polyaniline composition comprising the following components (a) and (b):
(a) a substituted or unsubstituted polyaniline composite which is protonated by an organic protonic acid or its salts represented by the following formula (I):

$$M(XCR^4(CR^5{}_2COOR^6)COOR^7)_p \quad \text{(I)}$$

wherein
M is a hydrogen atom, or an organic or inorganic free radical;
X is an acidic group;
$R^4$ and $R^5$ are independently a hydrogen atom, a hydrocarbon group or a $R^8{}_3Si-$ group wherein $R^8$ is a hydrocarbon group and three $R^8$s may be the same or different;

$R^6$ and $R^7$ are independently a hydrocarbon group having 4 or more carbon atoms which may have a substituent or a —$(R^9O)q$-$R^{10}$ group wherein $R^9$ is a hydrocarbon group or a silylene group, $R^{10}$ is a hydrogen atom, a hydrocarbon group or a $R^{11}_3Si$— group (wherein $R^{11}$ is a hydrocarbon group and three $R^{11}$s may be the same or different) and q is an integer of 1 or more; and p is a valence of M; and (b) A compound having a phenolic hydroxyl group.

2. The organic thin film transistor according to 1, wherein the organic protonic acid or its salts represented by the formula (I) is a sulfosuccinic acid derivative represented by the following formula (II):

$$M(O_3SCH(CH_2COOR^{12})COOR^{13})m \quad (II)$$

wherein M is a hydrogen atom, or an organic or inorganic free radical;

$R^{12}$ and $R^{13}$ are independently a hydrocarbon group having 4 or more carbon atoms which may have a substituent or a —$(R^{14}O)r$-$R^{15}$ group wherein $R^{14}$ is a hydrocarbon group or a silylene group, $R^{15}$ is a hydrogen atom, a hydrocarbon group or a $R^{16}_3Si$— group (wherein $R^{16}$ is a hydrocarbon group and three $R^{16}$s may be the same or different) and r is an integer of 1 or more; and m is the valence of M.

3. The organic thin film transistor according to 1 or 2, wherein the (b) compound having a phenolic hydroxyl group is a compound represented by the following formula (A):

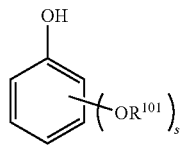

(A)

wherein s is an integer of 0 to 5;

$R^{101}$ is a hydrogen atom, an alkyl group having 1 to 20 carbon atoms, an alkenyl group having 2 to 20 carbon atoms, a cycloalkyl group having 3 to 10 carbon atoms that form a ring (hereinafter referred to as "ring carbon atoms"), an aryl group having 6 to 20 ring carbon atoms, an alkylaryl group having 7 to 20 carbon atoms or an arylalkyl group having 7 to 20 carbon atoms; and when s is 2 or more, plural $R^{101}$s may be the same or different.

4. The organic thin film transistor according to 1 or 2, wherein the (b) compound having a phenolic hydroxyl group is a compound represented by the following formula (B):

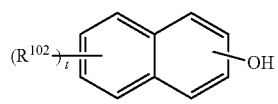

(B)

wherein t is an integer of 0 to 7;

$R^{102}$ is an alkyl group having 1 to 20 carbon atoms, an alkenyl group having 2 to 20 carbon atoms, an alkylthio group having 1 to 20 carbon atoms, a cycloalkyl group having 3 to 10 ring carbon atoms, an aryl group having 6 to 20 ring carbon atoms, an alkylaryl group having 7 to 20 carbon atoms or an arylalkyl group having 7 to 20 carbon atoms; and when t is 2 or more, plural $R^{102}$s may be the same or different.

5. The organic thin film transistor according to 1 or 2, wherein the (b) compound having a phenolic hydroxyl group is a compound represented by the following formula (C):

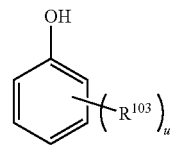

(C)

wherein u is an integer of 1 to 5;

$R^{103}$ is a halogen atom, an alkyl group having 1 to 20 carbon atoms, an alkenyl group having 2 to 20 carbon atoms, an alkylthio group having 1 to 20 carbon atoms, a cycloalkyl group having 3 to 10 ring carbon atoms, an aryl group having 6 to 20 ring carbon atoms, an alkylaryl group having 7 to 20 carbon atoms, an arylalkyl group having 7 to 20 carbon atoms or a COOH group; and when u is 2 or more, plural $R^{103}$s may be the same or different.

6. The organic thin film transistor according to 1 or 2, wherein the (b) compound having a phenolic hydroxyl group is a compound represented by the following formula (D):

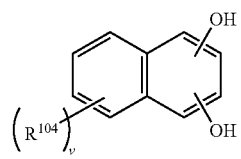

(D)

wherein v is an integer of 0 to 6;

$R^{104}$ is a hydrocarbon group, a hetero-containing hydrocarbon group, a halogen atom, a carboxyl group, an amino group, an SH group, a sulfonic acid group or a hydroxyl group; and when v is 2 or more, plural $R^{104}$s may be the same or different.

7. The organic thin film transistor according to 1 or 2, wherein the (b) compound having a phenolic hydroxyl group is one or more selected from phenol, o-, m- or p-cresol, cathecol, resorcinol, chlorophenol, salicyclic acid, hydroxybenzoic acid, hydroxynaphthalene, a phenol resin, polyphenol and poly(hydroxystyrene)

8. The organic thin film transistor according to any one of 1 to 7, wherein the HOMO level of the organic semiconductor layer is larger than the HOMO level of Au.

In the organic thin film transistor of the invention, by using a layer containing a specific conductive polyaniline composition as at least the source electrode or the drain electrode, it is possible to use the layer as a hole injection region which is in contact with the organic semiconductor layer of the organic thin film transistor. As a result, the hole injection is promoted at the time of driving the organic thin film transistor, and the organic thin film transistor can be driven at a low driving voltage.

Further, according to the invention, it is possible to provide an organic thin film transistor having a high response (driving) speed.

MODE FOR CARRYING OUT THE INVENTION

Figure 1:
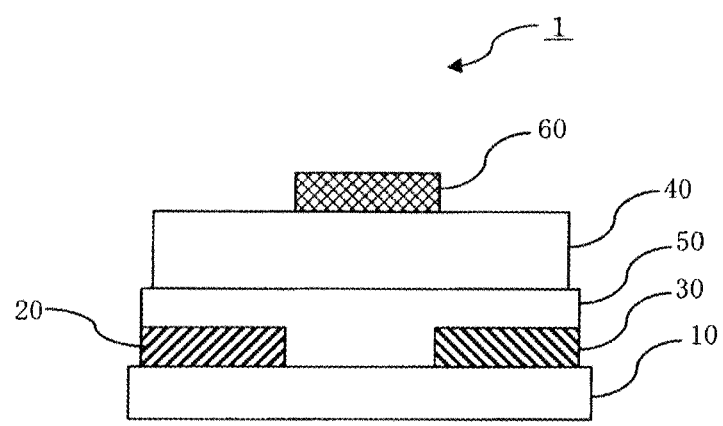
FIG. 1 is a view showing one embodiment of the organic thin film transistor of the invention (device A)
Figure 2:
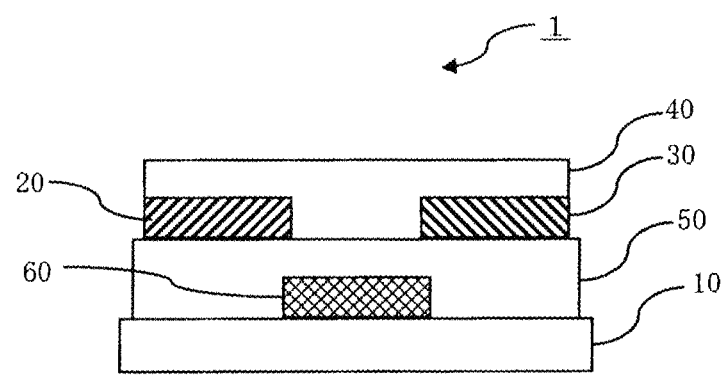
FIG. 2 is a view showing another embodiment of the organic thin film transistor of the invention (device B)

The device configuration, materials of each layer or the like of the organic thin film transistor of the invention will be explained below.

(Device Configuration)

The organic thin film transistor of the invention comprising at least a gate electrode, a source electrode, a drain electrode, an insulator layer and an organic semiconductor layer, at least one of the source electrode and the drain electrode comprising a conductive polyaniline composition comprising the following components (a) and (b).

(Conductive Polyaniline Composition)

(a) A substituted or unsubstituted polyaniline composite which is protonated by an organic protonic acid or its salts (hereinafter, referred to as an organic protonic acid or its salts (I)) represented by the following formula (I):

$$M(XCR^4(CR^5_2COOR^6)COOR^7)_p \qquad (I)$$ 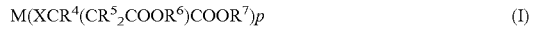

wherein

M is a hydrogen atom or an organic or inorganic free radical;

X is an acidic group;

$R^4$ and $R^5$ are independently a hydrogen atom, a hydrocarbon group or a $R^8_3Si$-group wherein $R^8$ is a hydrocarbon group and three $R^8$s may be the same or different;

$R^6$ and $R^7$ are independently a hydrocarbon group having 4 or more carbon atoms which may have a substituent or a $-(R^9O)q-R^{10}$ group wherein $R^9$ is a hydrocarbon group or a silylene group, $R^{10}$ is a hydrogen atom, a hydrocarbon group or a $R^{11}_3Si$-group (wherein $R^{11}$ is a hydrocarbon group and three $R^{11}$s may be the same or different) and q is an integer of 1 or more, and p is a valence of M; and (b) A compound having a phenolic hydroxyl group.

No specific restrictions are imposed on the configuration of the organic thin film transistor of the invention, as long as it is an organic thin film transistor which comprises at least three terminals of a gate electrode, a source electrode and a drain electrode, an insulator layer and an organic semiconductor layer, a carrier injection layer (region) is formed between the organic semiconductor layer and the source electrode and the drain electrode, and current flowing between the source electrode and the drain electrode is controlled by applying a voltage to the gate electrode. The organic thin film transistor of the invention may have a known device configuration. Of these, as the representative device configuration of the organic thin film transistor, devices A to D are shown in FIGS. 1 to 4 (in the figures, 1 indicates an organic thin film transistor, 10 indicates a substrate, 20 indicates a source electrode, 30 indicates a drain electrode, 40 indicates an organic semiconductor layer, 50 indicates an insulator layer and 60 indicates a gate electrode). Accordingly, several configurations are known depending on the position of the electrodes, the stacking order of the layers or the like. The organic thin film transistor of the invention has a field effect transistor (FET: Field Effect Transistor) structure. The organic thin film transistor comprises an organic semiconductor layer (organic compound layer), a source electrode and a drain electrode which are formed such that they oppose to each other with a predetermined interval therebetween, and a gate electrode which is formed with a predetermined interval from the source electrode/drain electrode. By applying a voltage to the gate electrode, current flowing between the source electrode and the drain electrode is controlled. Here, the distance between the source electrode and the drain electrode is determined according to the application where the organic thin film transistor is used, and normally 0.1 μm to 1 mm, preferably 1 μm to 300 μm.

Figure 3:
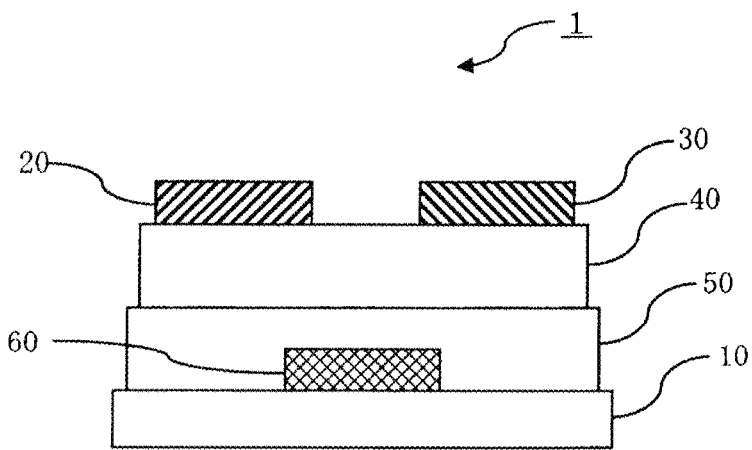
FIG. 3 is a view showing another embodiment of the organic thin film transistor of the invention (device C)

Of the devices A to D, the device C shown in FIG. 3 is further explained in detail as an example. The organic thin film transistor 1 as the device C has, on a substrate 10, a gate electrode 60 and an insulator layer 50 in this sequence. On the insulator layer 50, an organic semiconductor layer 40 is formed. On this semiconductor layer 40, a pair of a source electrode 20 and a drain electrode 30 are formed with a predetermined interval therebetween. The organic semiconductor layer 40 has a channel region, and the organic thin film transistor conducts an on-off operation by controlling the current flowing between the source electrode 20 and the drain electrode 30 by a voltage applied to the gate electrode 60. In the organic thin film transistor of the invention, by using the source electrode 20 and/or a drain electrode 30 comprising a specific polyaniline composition, a part of the source electrode 20 and/or the drain electrode 30 which is in contact with the organic semiconductor layer serves as a carrier injecting layer. Contact resistance between these electrodes 20 and 30 and the organic semiconductor layer 40 becomes small, whereby the driving voltage can be lowered. In the meantime, the specific conductive polyaniline composition is used in order to improve the hole injection, and hence, at least one of the source electrode and the drain electrode may be composed of a specific conductive polyaniline composition. In respect of productivity, it is preferred that both of the source electrode and the drain electrode be composed of a specific conductive polyaniline composition.

(Conductive Polyaniline Composition)

The conductive polyaniline composition used for forming the source electrode and/or the drain electrode in the organic thin film transistor of the invention will be explained below.

The conductive polyaniline composition used in the invention comprises (a) a substituted or unsubstituted polyaniline composite which is protonated by an organic protonic acid represented by the following formula (I) or its salts and (b) a compound containing a phenolic hydroxyl group.

$$M(XCR^4(CR^5_2COOR^6)COOR^7)_p \qquad (I)$$ 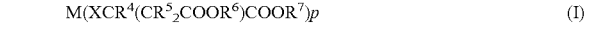

As the substituent of the substituted polyaniline, for example, a straight-chain or a branched hydrocarbon group such as a methyl group, a hexyl group and an octyl group, an alkoxy group and an aryloxy group such as a methoxy group and a phenoxy group and a halogen-containing hydrocarbon group such as a $CF_3$ group or the like can be given.

In the formula (I), M is a hydrogen atom or an organic or inorganic free radical. As the organic free radical, a pyridinium group, an imidazolium group, an anillinium group or the like can be given, for example. As the inorganic free radical, sodium, lithium, potassium, cerium, ammonium or the like can be given, for example.

X is an acidic group. For example, a —$SO_3^-$ group, a —$PO_3^{2-}$ group, —$PO_4(OH)^-$ group, a —$OPO_3^{2-}$ group, a —$OPO_2(OH)^-$ group, a —$COO^-$ group or the like can be given, with a —$SO_3^-$ group being preferable.

$R^4$ and $R^5$ are independently a hydrogen atom, a hydrocarbon group or a $R^8{}_3Si$ group (wherein $R^8$ is a hydrocarbon group and the three $R^8$s may be the same or different). As the hydrocarbon group when $R^4$ and $R^5$ are a hydrocarbon group, a straight-chain or branched alkyl group having 1 to 24 carbon atoms, an aryl group having 6 to 20 ring carbon atoms, an alkylaryl group having 7 to 20 carbon atoms or the like can be given.

As the straight-chain or branched alkyl group having 1 to 24 carbon atoms, a methyl group, an ethyl group, an n-propyl group and an isopropyl group can be given, for example. As the aryl group having 6 to 20 ring carbon atoms, a phenyl group can be given, for example. As the alkylaryl group having 7 to 20 carbon atoms, a group obtained by combining the alkyl group and the aryl group can be given, for example.

As the hydrocarbon group when $R^8$ is a hydrocarbon group, the same groups as those for $R^4$ and $R^5$ can be given.

$R^6$ and $R^7$ are independently a hydrocarbon group having 4 or more carbon atoms which may have a substituent or a —$(R^9O)q$-$R^{10}$ group wherein $R^9$ is a hydrocarbon group or a silylene group, $R^{10}$ is a hydrogen atom, a hydrocarbon group or a $R^{11}{}_3Si$— (wherein $R^{11}$ is a hydrocarbon group and three $R^{11}$s may be the same or different) and q is an integer of 1 or more.

As the hydrocarbon group when $R^6$ and $R^7$ are a hydrocarbon group, an alkyl group (preferably having 4 to 24 carbon atoms), an aryl group (preferably having 6 to 20 ring carbon atoms), an alkylaryl group (preferably having 7 to 20 carbon atoms) or the like, which are straight-chain or branched, can be given. Specific preferable examples of the hydrocarbon group include a straight-chain or branched alkyl group having 4 to 24 carbon atoms such as a straight-chain or branched butyl group, a pentyl group, a hexyl group, a 2-ethylhexyl group, an octyl group (isooctyl group or the like) and a decyl group, which are straight-chain or branched.

As the substituent of the hydrocarbon group, a halogen atom such as bromine and chlorine, a hydroxyl group, a carboxyl group, a nitro group, an amino group, a cyano group or the like can be given.

As the hydrocarbon group when $R^9$ is a hydrocarbon group, straight-chain or branched alkylene group (preferably having 1 to 24 carbon atoms), an arylene group (preferably having 6 to 20 ring carbon atoms), an alkylarylene group (preferably having 7 to 20 carbon atoms), an arylalkylene group (preferably having 7 to 20 carbon atoms), or the like, which are straight-chain or branched, can be given. As the alkylene group, a methylene group or an ethylene group can be given, for example. As the arylene group, a phenylene group can be given, for example. As the alkylarylene group or the arylalkylene group, a group obtained by combining the alkyl group and the aryl group can be given, for example.

As the hydrocarbon group when $R^{10}$ and $R^{11}$ are a hydrocarbon group, the same groups as those for $R^4$ and $R^5$ can be given.

q is preferably 1 to 10.

p is the valence of the above-mentioned M.

It is further preferred that the above-mentioned organic protonic acid or its salts (I) be a sulfosuccinic acid derivative represented by the following formula (II) (hereinafter often referred to as the sulfosuccinic acid derivative (II)):

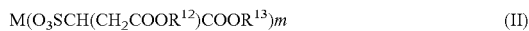

(II)

In the above-mentioned formula (II), M and m are the same as those in the formula (I).

$R^{12}$ and $R^{13}$ are independently a hydrocarbon group having 4 or more carbon atoms which may have a substituent or a —$(R^{14}O)r$-$R^{15}$ group wherein $R^{14}$ is a hydrocarbon group or a silylene group, $R^{15}$ is a hydrogen atom, a hydrocarbon group or a $R^{16}{}_3Si$— group (wherein $R^{16}$ is a hydrocarbon group and the three $R^{16}$s may be the same or different) and r is an integer of 1 or more.

As the hydrocarbon group when $R^{12}$ and $R^{13}$ are a hydrocarbon group, the same groups as those for $R^6$ and $R^7$ can be given. As for the substituent, the same substituents as those for $R^6$ and $R^7$ can be given.

In $R^{12}$ and $R^{13}$, as the hydrocarbon group when $R^{14}$ is a hydrocarbon group, the same group as that mentioned for $R^9$ can be given. In $R^{12}$ and $R^{13}$, as the hydrocarbon group when $R^{15}$ and $R^{16}$ are a hydrocarbon group, the same groups as those for $R^4$ and $R^5$ can be given.

Specific examples when $R^{12}$ and $R^{13}$ are a —$(R^{14}O)r$-$R^{16}$ group, the same groups as those for —$(R^9O)q$-$R^{10}$ in $R^6$ and $R^7$ can be given.

It is preferred that r be 1 to 10.

The above-mentioned organic protonic acid or its salts (I) has a function of protonating polyaniline, and in the polyaniline composite (a), it is present as a dopant (counter anion). That is, in the composition of the invention, two compounds, i.e. the above-mentioned protonic acid or is salts (I) and the compound (b) containing a phenolic hydroxyl group serve as the dopant. The work function of the polyaniline compound used in the invention is about 5.0 eV. That is, it has an energy level which is equivalent to that of Au which is normally used in the source/drain electrode of an organic TFT. It could not be expected that hole injection properties larger than those of Au can be obtained by combination of the polyanilline compound with an organic semiconductor.

The above-mentioned organic protonic acid or its salts (I) is thought to be present in the form of an anion in the composition of the invention. By using the organic protonic acid or its salts (I), when an organic thin film transistor is fabricated, due to the interaction with the organic semiconductor thin film which is in contact with, an intermediate region promoting injection of holes in the interface is formed, whereby effects of lowering the driving voltage which are unexpected from the normal combination of energy levels can be developed.

In the (a) polyaniline composite, no specific restrictions are imposed on the composition ratio of polyaniline and organic protonic acid or its salts (I). However, the molar ratio of the monomer unit of polyaniline/organic protonic acid or its salts (I) is normally 0.1 to 2, preferably 0.1 to 0.5. If the amount ratio of the organic protonic acid or its salts (I) is too small, the electric conductivity may not be increased. Further, if the amount ratio of the organic protonic acid or its salts is too large, the amount ratio of polyaniline controlling the electric properties of a shaped product becomes small, leading to a lowering of electric conductivity. The weight composition ratio varies depending on the molecular weight of protonic acid. However, since high electric properties are exhibited, it is preferable that the composite be a composite containing substituted or unsubstituted polyaniline in the protonated substituted or unsubstituted polyaniline composite (a) in an amount of 20 mass % to 70 mass %.

An organic protonic acid or its salts (I) used in the invention can be produced by a known method. For example, by a reaction of a sulfophthalic acid derivative or a sulfosuccinic acid derivative with desired alcohol, it is possible to obtain a corresponding sulfophthalic acid ester derivative or a corresponding succinic acid ester derivative. Further, it is known that a corresponding sulfosuccinic acid ester derivative can be obtained by hydrosulfonating a maleic acid ester with sodium hydrogen sulfate.

A commercially available organic protonic acid or its salts (I) can be used. Examples of the commercially available organic protonic acid or its salts (I) include Aerosol OT (diisooctyl sodium sulfosuccinate, manufactured by Wako Pure Chemical Industries, Ltd.), Lipal 870P (manufactured by Lion Corporation) or the like can be given. Commercial products may differ in purity, and a suitable one can be selected for use according to need.

(Organic Solvent)

For the conductive polyaniline composition, an organic solvent which is essentially not miscible with water (hereinafter referred to as a water-immiscible organic solvent) can be used. For example, hydrocarbon solvents such as benzene, toluene, xylene, ethylbenzene and tetraline; a halogen-containing solvent such as methylene chloride, chloroform, carbon tetrachloride, dichloroethane, trichloroethane and tetrachloroethane; and an ester-based solvent such as ethyl acetate can be mentioned. Of these, toluene, xylene, chloroform, trichloroethane, ethyl acetate or the like are preferable. Normally, polyaniline is rarely dissolved in a solvent, and hence, in many cases, it is applied in the form of a dispersion obtained by dispersing it in a solvent to form a thin film. However, the polyaniline composition of the invention can be soluble completely in an organic solvent on the molecular basis. Accordingly, when an organic thin film transistor is fabricated, the interaction with the organic semiconductor thin film can be promoted.

In the conductive polyanilline composition, although the amount ratio of the (a) polyaniline composite in a water-immiscible organic solvent varies depending on the type of the water-immiscible organic solvent, normally it is 900 g/L or less, preferably 0.01 to 300 g/L or less. If the content of the (a) polyaniline composite is too large, the solution state cannot be maintained, handling at the time of shaping a film may be difficult, whereby homogeneity of a film may be deteriorated. On the other hand, if the concentration is small, a film may not be substantially formed even if the solution is applied. Further, if the concentration is large, the fluidity of the solution is lowered, and a homogenous film is hardly formed.

The weight average molecular weight of the polyaniline is normally 1,000 g/mol to 1,000,000 g/mol, preferably, 10,000 g/mol to 1,000,000 g/mol, further preferably 100,000 g/mol to 1,000,000 g/mol. Due to the high molecular weight, the strength or stretchability of an electrode obtained from the composition can be improved. However, if the molecular weight is too large, the polyaniline composite is hardly dissolved in a solvent, affecting adversely the production of an electrode. The molecular weight of polyaniline is measured by the gel permeation chromatography (GPC). If the molecular weight is increased, the conjugation length becomes long, and electric conductivity becomes large. In addition, since the viscosity of the solution is also increased, a wide range of coating conditions can be set in the coating process.

(b) Compound Containing a Phenolic Hydroxyl Group

As the (b) compound containing a phenolic hydroxyl group, a compound having a structure represented by any of the following formulas (A) to (D) can be preferably given.

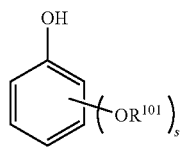

(A)

In the formula (A), s is an integer of 0 to 5, preferably an integer of 0 to 3, more preferably 0 or 1. When n is 0, the compound is phenol.

$R^{101}$ is a hydrogen atom, an alkyl group having 1 to 20 carbon atoms, an alkenyl group having 2 to 20 carbon atoms, a cycloalkyl group having 3 to 10 ring carbon atoms, an aryl group having 6 to 20 ring carbon atoms, an alkylaryl group having 7 to 20 carbon atoms or an arylalkyl group having 7 to 20 carbon atoms. When s is 2 or more, plural $OR^{101}$s may be the same or different.

It is preferred that the substitution position of $—OR^{101}$ be the meta- or para-position relative to the phenolic hydroxyl group. By allowing the substitution position of $—OR^{101}$ be the meta- or para-position, steric hindrance of the phenolic hydroxyl group is decreased, whereby the conductivity of conductive polyaniline composition can be further enhanced.

As the alkyl group having 1 to 20 (preferably 1 to 6) carbon atoms, a methyl group, an ethyl group, a propyl group, an isopropyl group, a butyl group, an isobutyl group, a tert-butyl group or the like can be given. As the alkenyl group having 1 to 20 carbon atoms, a group having one unsaturated bond in the molecule of the above-mentioned alkyl groups can be given. As the cycloalkyl group having 3 to 20 ring carbon atoms, a cyclopentyl group, a cyclohexyl group or the like can be given. As the aryl group having 6 to 20 ring carbon atoms, phenyl, naphthyl or the like can be given.

As the alkylaryl group having 7 to 20 carbon atoms and the arylalkyl group having 7 to 20 carbon atoms, a group obtained by combining the alkyl group and the aryl group as mentioned above can be given.

Specific examples of the phenolic compound represented by the formula (A) include phenol, catecol, resorcinol, methoxyphenol, ethoxyphenol, propoxyphenol, isopropoxyphenol, butyloxyphenol, isobutyloxyphenol and tert-butyloxyphenol.

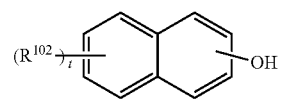

(B)

In the formula (B), t is an integer of 0 to 7, preferably an integer of 0 to 3, more preferably 0 or 1.

$R^{102}$ is an alkyl group having 1 to 20 carbon atoms, an alkenyl group having 2 to 20 carbon atoms, an alkylthio group having 1 to 20 carbon atoms, a cycloalkyl group having 3 to 10 ring carbon atoms, an aryl group having 6 to 20 ring carbon atoms, an alkylaryl group having 7 to 20 carbon atoms or an arylalkyl group having 7 to 20 carbon atoms. When t is 2 or more, plural $R^{102}$s may be the same or different. Specific examples of $R^{102}$ include those given in the formula (A). Specific examples of the alkyl group in the alkylthio group having 1 to 20 carbon atoms include those given in the formula (A).

Specific examples of the phenolic compound represented by the formula (B), hydroxynaphthalene can be given, for example.

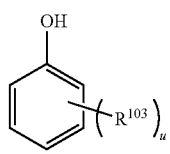

(C)

In the formula (C), u is an integer of 1 to 5, preferably 1 to 3, and more preferably 1.

$R^{103}$ is a halogen atom, an alkyl group having 1 to 20 carbon atoms, an alkenyl group having 2 to 20 carbon atoms, an alkylthio group having 1 to 20 carbon atoms, a cycloalkyl group having 3 to 10 carbon atoms, an aryl group having 6 to 20 ring carbon atoms, an alkylaryl group having 7 to 20 carbon atoms, an arylalkyl group having 7 to 20 carbon atoms or a COOH group. When u is 2 or more, plural $R^{103}$s may be different. Specific examples of $R^{103}$ include those exemplified in the formula (A). Specific examples of the alkyl group in the alkylthio having 1 to 20 carbon atoms include those exemplified in the formula (A). As the halogen atom, a fluorine atom, a chlorine atom, a bromine atom and an iodine atom can be given.

Specific examples of the compound represented by the formula (C) include o-, m- or p-cresol, o-, m- or p-ethylphenol, o-, m- or p-propylphenol, o-, m- or p-butylphenol, o-, m- or p-chlorophenol, salicyclic acid, hydroxybenzoic acid or the like.

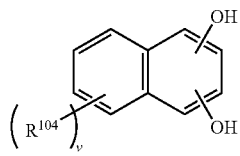

(D)

In the formula (D), v is an integer of 0 to 6. v is preferably 0.

$R^{104}$ is a hydrocarbon group, a hetero-containing hydrocarbon group, a halogen atom, a carboxyl group, an amino group, an SH group, a sulofnic acid group or a hydroxyl group. When v is 2 or more, plural $R^{104}$s may be the same or different.

As the hydrocarbon group, an alkyl group having 1 to 20 carbon atoms, an alkenyl group having 2 to 20 carbon atoms, a cycloalkyl group having 3 to 10 ring carbon atoms, an aryl group having 6 to 20 ring carbon atoms, an alkylaryl group having 7 to 20 carbon atoms or an arylalkyl group having 7 to 20 carbon atoms can be given. Preferred examples are the same as those for the formula (A). As the hetero atom, a sulfur atom, an oxygen atom, a nitrogen atom or a halogen atom can be given.

It is preferred that the phenolic compound represented by the formula (D) have two or more hydroxyl groups which are not adjacent with each other.

As specific examples of the phenolic compound represented by the formula (D), 1,6-naphthalene diol, 2,6-naphthalene diol and 2,7-naphthalene diol can be given.

As the compounds other than the compounds represented by the formulas (A) to (D), a phenol resin, polyphenol and poly(hydroxystyrene) can be preferably given.

By using the (b) compound having a phenolic hydroxyl group, a thin film having a large electric conductivity can be obtained. A thin film having a large electric conductivity can be directly used as the source electrode and the drain electrode of the organic thin film transistor. The electric conductivity of the material is represented by the following formula:

σ=enμ (wherein σ is an electric conductivity, e is an elementary charge, n is a carrier density and μ is mobility). As a result of extensive studies, an increase in the electric conductivity is caused by both an increase in carrier density and an increase in mobility. It has been found that, an increase in carrier density leads to a further enhancement of the effects of decreasing the driving voltage by increasing interaction of the source electrode and/or the drain electrode with the organic semiconductor thin film which is in contact therewith when an organic thin film transistor is fabricated.

The amount of the (b) compound having a phenolic hydroxyl group is normally 0.01 to 1000 mass %, preferably 0.5 to 500 mass %, relative to the (a) protonated substituted or unsubstituted polyaniline composite. Further, the molar concentration of the (b) compound having a phenolic hydroxyl group relative to the total solution of the composition is preferably 0.01 mol/L to 5 mol/L, with 0.05 mol/L to 1 mol/L being further preferable.

The (b) compound having a phenolic hydroxyl group has an effect of increasing the electric conductivity. In general, in a region where the concentration of the (b) compound having a phenolic hydroxyl group is low, the electric conductivity tends to be increased if the concentration thereof is high. If the concentration is too large, the (b) compound having a phenolic hydroxyl group as an auxiliary material is present in the film in a larger amount than the polyaniline. On the contrary, in a region where the concentration is high, the electric conductivity may tend to be lowered with the concentration. Further, the homogeneity of the composition may be deteriorated or a large amount of heat or labor such as time is required when removing by evaporation, whereby it becomes a material having deteriorated electric properties.

The composition used in the invention which comprises the (a) polyaniline composite and the (b) compound containing a phenolic hydroxyl group (conductive polyaniline composition) can be obtained by adding the (b) compound containing a phenolic hydroxyl group to the (a) polyaniline composite which is obtained in the state where it is dissolved in a water-immiscible organic solvent. Specifically, the (b) compound having a phenolic hydroxyl group may be added in the solid state or in the liquid state, or may be added in the state where it is dissolved or dispersed in a water-immiscible solvent. It is preferred that a suitable method for adding a solvent capable of maintaining the dissolved state after the addition be selected.

In addition to the above-mentioned components, to the conductive polyaniline composition used in the invention, other resins, inorganic materials, conductive materials, a curing agent, a plasticizer or the like may be added within an amount range which does not impair the function of the source electrode or the drain electrode of the organic TFT.

Other resins are added as a base binder, a plasticizer, a matrix base or the like. Specific examples thereof include polyolefins such as polyethylene and polypropylene, chlorinated polyolefin, polystyrene, polyester, polyamide, polyacetal, polycarbonate, polyethylene glycol, polyethylene oxide, polyacrylic acid, polyacrylic acid ester, polymethacrylic acid ester, polyvinyl alcohol or the like can be given. Of these, chlorinated polyolefin is preferable.

Further, instead of or together with a resin, a precursor capable of forming a thermosetting resin such as an epoxy resin, a urethane resin, a phenol resin or the like may be used.

An inorganic material is added in order to improve the mechanical properties such as the strength, the surface hardness, and the dimensional stability, and the specific examples thereof include silica (silicon dioxide), titania (titanium dioxide), alumina (aluminum oxide) or the like can be given.

A conductive material is used in order to further improve the conductivity of the polyaniline composition. Specific examples thereof include metal fine particles such as Ag, Au, Cu, Fe, Al and Ti, and particles such as ITO and C (carbon).

A curing agent is added in order to improve the strength, the surface hardness, the dimensional stability and other mechanical properties. Specific examples thereof include a heat curing agent such as a phenol resin, a light curing agent by an acrylic monomer and a photo-polymerization initiator.

A plasticizer is added in order to improve mechanical properties such as tensile strength and bending strength, and specific examples thereof include phthalic acid esters and phosphoric acid esters.

In the polyaniline composition used in the invention, the (b) compound having a phenolic hydroxyl group is present not as a solvent but as a dopant. As for the fact that the (b) compound having a phenolic hydroxyl group is a dopant, since a cast produced from the composition of the invention to which the (b) compound having a phenolic hydroxyl group is added has a significantly high electric conductivity as compared with a cast to which this compound is not added, it is apparent that the (b) compound having a phenolic hydroxyl group remains. That is, if the (b) compound having a phenolic hydroxyl group is merely a solvent, when forming a cast, the solvent is easily evaporated and removed by heating. However, when it is present in the form of a dopant, it is electrically charged. Therefore, in order to remove it from polyaniline, a large amount of energy is required. That is, it cannot be removed by heating at a temperature which allows the dopant to be evaporated.

As the method for applying the conductive polyaniline composition to a substrate such as an organic semiconductor layer, a known, generally-used method such as the cast method, the spray method, the dip coating method, the doctor blade method, the bar coating method, the spin coating method, the screen printing method and the gravure printing method can be used. In order to remove the water-immiscible organic solvent, it suffices that heating is conducted to allow the organic solvent to be evaporated. As the method for evaporating the water-immiscible organic solvent, heating is conducted in the stream of an air at a temperature of 250° C. or less, preferably 50 to 200° C., for example. Further, according to need, heating is conducted under reduced pressure. The heating temperature and the heating time are not particularly restricted, and can be appropriately selected according to the materials used. As the specific method for forming an electrode by applying the conductive polyaniline composition to a base material such as an organic semiconductor layer, a method in which coating is conducted by means of a dispenser, which is given in the examples mentioned later, can be given.

(Organic Semiconductor Layer)

No specific restrictions are imposed on the organic semiconductor used in the organic semiconductor layer in the organic thin film transistor of the invention, and an organic semiconductor used in a known organic thin film transistor can be used. Specific examples are given below.

(Material to be Used in an Organic Semiconductor Layer)

Normally, a crystalline material is used since a high field effect mobility can be obtained.

Specifically, the following materials can be exemplified.

(1) A fused polycyclic aromatic compounds which may have a substituent such as naphthalene, anthracene, tetracene, pentacene, hexacene, heptacene, picene, coronene, chrysene, pyrene, benzopyrene, corannulene, ovalene, triphenylene, phenanthrene, pentaphene, helicene, or the like.

(2) A compound having a styryl structure represented by $C_6H_5$—CH=CH—$C_6H_5$ such as 1,4-bisstyryl benzene, 1,4-bis(2-methylstyryl)benzene, 1,4-bis(3-methylstyryl)benzene, 1,4-bis(4-methylstyryl)benzene(4MSB) and polyphenylene vinylene, an oligomer or a polymer of these compounds (3) Compound having the thiophene ring shown below A. Thiophene oligomer which may have a substituent such as derivatives of α-4T, α-5T, α-6T, α-7T and α-8T B. Thiophene-based polymer such as polyhexylthiophene and a fluorene-bithiophene copolymer (F8T2)

C. Fused oligothiophene such as a bisbenzothiophene derivative, α,α'-bis(dithieno[3,2-b:2',3'-d]thiophene), a co-oligomer of dithienothiophene-thiophene, and pentathienoacene. In particular, a compound having a thienobenzene skeleton or a dithienobenzene skeleton and a dibenzothienobenzothiophene derivative are preferable.

(4) Selenophene oligomers, porphyrins such as metal-free phthalocyanine, copper phthalocyanine, lead phthalocyanine, titanyl phthalocyanine, platinum porphyrin, porphyrins and benzoporphyrin, tetrathiafulvalene (TTF) and its derivatives, rubrene and its derivatives (5) Quinoid oligomers such as tetracyanoquinodimethane (TCNQ) and 11,11,12,12-tetracyanonaphtho-2,6-quinodimethane (TCNNQ), fullerenes such as C60, C70 and PCBM, and tetracarboxylic acids such as N,N'-diphenyl-3,4,9,10-perylenetetracarboxylic acid dimide, N,N'-dioctyl-3,4,9,10-perylenetetracarboxylic acid dimide (C8-PTCDI), NTCDA, and 1,4,5,8-naphthalenetetracarboxylicdimide (NTCDI).

(6) Hetero aromatic compounds which may have a substituent such as furan, dibenzofuran, pyrrole and imidazole and a fused aromatic ring compound using having them as a matrix (7) Nonbenzenoid aromatic compounds which may have a substituent such as annulene, azulene, cyclopentadienyl anion, cycloheptatriethyl cation (tropylium ion), toropone, methallocene and acepleiadylene and a fused aromatic ring compound using them as a matrix Of these compounds, one having a larger HOMO level (that is, having a large ionization potential (Ip)) has significant effects of lowering the driving voltage. That is, a compound having a large HOMO level has a high barrier for injecting holes, and hence the driving voltage tends to be high. By using the polyaniline composition of the invention in contact with these compounds, the effects of decreasing the injection barrier are high. As mentioned above, in the p-type organic thin film transistor, Au is typically used as the source electrode and the drain electrode, and if the HOMO level of the organic semiconductor is larger than the work function of the Au, the driving voltage of the organic thin film transistor is increased. Therefore, in an organic thin film transistor using an organic semiconductor having a higher HOMO level than that of Au and a high injection barrier of holes, it is particularly preferable to use the polyaniline composition of the invention as the source electrode and the drain electrode. In such an organic thin film transistor, effects of decreasing the driving voltage are significant. Since the work function of Au is 5.1 eV, it is desirable to use a material having a HOMO level which is equal to or larger than the HOMO level of the organic semiconductor. As the organic semiconductor satisfying the above-mentioned requirements, the following can be given.

A compound having 4 or less linearly fused aromatic rings, which each may have a substituent, such as naphthalene, anthracene, tetracene, picene, coronene, chrysene, pyrene, benzopyrene, corannulene, ovalene, triphenylene, phenanthrene, pentaphene, helicene, dibenzoanthracene, dibenzochrysene, and dibenzopicene; a compound which may have a substituent represented by $C_6H_5$—CH=CH—$C_6H_5$, 5 or less oligomers of these compounds, fused oligothiophene such as bisbenzothiophene derivatives, α,α'-bis(dithieno[3,2-b:2',3'-d]thiophene, a co-oligomer of dithienophene-thiophene and pentathienoacene (in particular, a compound having a thienobenzene skeleton or a dithienobenzene skeleton), a dibenzothienobenzothiophene derivative, heteroaromatic compounds which may have other substituent such as furan, dibenzofuran, pyrrole and imidazole and a fused aromatic ring compound having them as a matrix, a compound having 4 or less linearly fused aromatic rings such as nonbenzenoid aromatic compounds which may have a substituent such as annulene, azulene, cyclopentadienyl anion, cycloheptatriethyl cation (tropylium ion), toropone, methallocene and acepleiadylene and a fused aromatic ring compound using them as a matrix.

A material in which the number of linearly fused aromatic rings is limited to 4 or less has a short conjugated length and has a large HOMO level. Due to the contact of these organic semiconductors with the conductive polyaniline composition, an interaction is generated, whereby lowering in driving voltage can be attained. The interaction occurs mainly by the organic protonic acid or its salts (I) in the conductive polyaniline composition, and hence, effects of lowering the driving voltage are brought about without adding the (b) compound having a phenolic hydroxyl group as another dopant. By adding the (b) compound having a phenolic hydroxyl group, conductivity of the conductive polyaniline composition is significantly improved, and a drop in voltage as the electrode can be suppressed to a minimum level. In addition, the (b) compound having a phenolic hydroxyl group further promotes the interaction between an organic protonic acid or its salts (I) and an organic semiconductor.

(Substrate)

In the invention, a gate electrode or the like are normally formed on a substrate. The substrate has a function of supporting the structure of the organic thin film transistor. As the material for the substrate, in addition to glass, inorganic compounds such as metal oxides or nitrides, plastic films (PET, PES, PC or the like) or a metal substrate or a composite or a lamination or the like of these can be used. Further, if the structure of the organic thin film transistor can be fully supported by other constitutional elements than the substrate, the substrate may not be used. As the material for the substrate, silicon (Si) wafer may frequently be used. However, it is possible to use Si itself as the substrate which also functions as the gate electrode. Further, it is possible to oxidize the surface of Si to form $SiO_2$ to use it as an insulating layer. In this case, a layer of a metal such as Au may be formed on the Si substrate which also functions as the gate electrode as the electrode for connecting a lead wire.

(Gate Electrode)

No specific restrictions are imposed on the material for the gate electrode in the organic thin film transistor of the invention as long as it is a conductive material. Platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide antimony, indium tin oxide (ITO), fluoride-doped zinc oxide, zinc, carbon, graphite, glassy carbon, silver paste and carbon paste, lithium, beryllium, sodium, magnesium, potassium, calcium, scandium, titanium, manganese, zirconium, gallium, niobium, a sodium-potassium alloy, magnesium, lithium, aluminum, a magnesium/copper mixture, a magnesium/silver mixture, a magnesium/aluminum mixture, a magnesium/indium mixture, an aluminum/aluminum oxide mixture, a lithium/aluminum mixture, or the like can be used. They are formed into a film by the sputtering method or the vacuum vapor deposition method.

The gate electrode can also be formed by using a fluidic electrode material such as a solution, a paste, ink, a dispersion liquid or the like, each containing the above-mentioned conductive material. As the solvent or the dispersion medium in the above-mentioned fluidic electrode material, in order to suppress damage on an organic semiconductor, it is preferable to use a solvent or a dispersion medium containing 60 mass % or more, preferably 90 mass % or more of water. As the dispersion containing metal fine particles, a known conductive paste or the like can be used, for example. Normally, a dispersion containing metal fine particles having a particle size of 0.5 nm to 50 nm or 1 nm to 10 nm is preferable. As the material for metal fine particles, platinum, gold, silver, nickel, chromium, copper, iron, tin, lead, antimony, tantalum, indium, palladium, tellurium, rhenium, iridium, aluminum, ruthenium, germanium, molybdenum, tungsten, zinc, or the like can be used.

It is preferable to form electrodes using a dispersion in which these metal fine particles are dispersed in a dispersion medium such as water or common organic solvents by using a dispersion stabilizer formed mainly of an organic material. As the method for producing a dispersion of metal fine particles, a physical forming method such as the gas evaporation method, the sputtering method and the metal vapor synthesis method or a chemical forming method such as the colloidal method and the co-precipitation method, in which metal ions are reduced in a liquid phase to form metal fine particles. The colloidal method disclosed in JP-A-H11-76800, JP-A-H11-80647, JP-A-H11-319538, JP-A-2000-239853 and the gas evaporation method disclosed in JP-A-2001-254185, JP-A-2001-53028, JP-A-2001-35255, JP-A-2000-124157 and JP-A-2000-123634 are preferable.

The electrode is shaped by using a dispersion of these metal fine particles, and the solvent is dried. Thereafter, if necessary, the electrode is heated along with the shape thereof at a temperature of 100° C. to 300° C., preferably 150° C. to 200° C., whereby fine metal particles are thermally bonded, thus making it possible to form an electrode pattern having an intended shape.

It is also preferable to use known conductive polymers of which the conductivity is improved by doping or the like. For example, conductive polyaniline, conductive polypyrrole, conductive polythiophene, (a complex of polyethylene dioxythiophene and polystyrene sulfonic acid or the like), a complex of polyethylene dioxythiophene (PEDOT) and polystyrene sulfonic acid or the like can be preferably used. For the material for the gate electrode, only conductivity is required. It is not restricted to the conductive polyaniline used in the source/drain electrode of the invention.

(Source Electrode/Drain Electrode)

As for at least one of the source electrode and the drain electrode in the organic thin film transistor of the invention, the polyaniline film formed from the conductive polyaniline composition serves as at least one of the source electrode and the drain electrode. If the electric resistance of the polyaniline film is high, it is possible to suppress power loss during power supply by covering the polyaniline film with a material having a further lower electric resistance or providing a material having a low electric resistance such that it is adjacent with the source electrode/drain electrode to allow it to serve as an auxiliary electrode. As the material having a low electric resistance, the same material as that used in the gate electrode can be similarly used.

As the method for forming the auxiliary electrode, deposition, electron beam deposition, sputtering, the atmospheric plasma method, ion plating, chemical vapor deposition, electrodeposition, electroless plating, spin coating, printing or ink jet or the like can be given. Further, the auxiliary electrode may be patterned as necessary. As the method of patterning the auxiliary electrode, a method in which a conductive thin film formed by the above-mentioned method is formed into electrodes by a known photolithographic method or a lift-off method, a method in which the conductive thin film formed by the above-mentioned method is heat-transferred to metal foil such as aluminum or copper, and then a resist is formed by the ink-jet method or the like, followed by etching can be given. The auxiliary electrode may be formed by directly performing patterning according to the ink-jet method by using the above-mentioned dispersion containing fine metal particles, or may be formed from a coating film by lithography, laser ablation or the like. Further, it is possible to use a method for patterning a conductive polymer, a conductive ink containing fine metal particles, a conductive paste or the like according to the printing method such as relief printing, intaglio printing, planographic printing or screen printing.

The film thickness of the thus formed auxiliary electrode is preferably 0.2 nm to 10 μm, further preferably 4 nm to 300 nm. As long as the thickness of the electrode is within this range, a drop in voltage is not caused by an increase in resistance due to a small film thickness. In the above-mentioned film thickness range, since it is not too large, film formation does not take time, and hence, stacking of layers can be conducted easily without causing steps when a protective layer, an organic semiconductor layer or other layers are stacked.

The source electrode or the drain electrode which is not formed from the conductive polyaniline composition can be formed from a known material.

(Insulator Layer)

No particular restrictions are imposed on materials used for an insulator layer in the organic thin film transistor of the invention as long as these materials have electric insulating properties and can be formed as thin films. It is possible to use materials, such as metal oxides (including oxides of silicon), metal nitrides (including nitrides of silicon), polymers, or organic low molecules, whose electrical resistivity is 10 Ωcm or more at room temperature. In particular, an inorganic oxide film having a high dielectric constant is preferable.

Examples of metal oxides include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride lanthanum oxide, fluorine oxide, magnesium oxide, bismuth oxide, bismuth titanate, niobium oxide, strontium bismuth titanate, strontium bismuth tantalate, tantalum pentoxide, bismuth tantalate niobate, trioxide yttrium, and combinations of these compounds. Silicon oxide, aluminum oxide, tantalum oxide and titanium oxide are preferable.

Further, metal nitrides, such as silicon nitride ($Si_3N_4$, SixNy, (x, y>0)) and aluminum nitride can be preferably used.

The insulator layer may be made of a precursor containing a metal alkoxide. In this case, for example, the substrate is covered with a solution of the precursor, and is subjected to a chemical solution process including a heat treatment, and, as a result, an insulator layer is formed. The metals forming the metal alkoxide are selected from transition metals, lanthanoids or main group elements. Specific examples of such metals include barium (Ba), strontium (Sr), titanium (Ti), bismuth (Bi), tantalum (Ta), zirconium (Zr), iron (Fe), nickel (Ni), manganese (Mn), lead (Pb), lanthanum (La), lithium (Li), sodium (Na), potassium (K), rubidium (Rb), cesium (Cs), francium (Fr), beryllium (Be), magnesium (Mg), calcium (Ca), niobium (Nb), thallium (Tl), mercury (Hg), copper (Cu), cobalt (Co), rhodium (Rh), scandium (Sc) and yttrium (Y). Examples of alkoxides forming the metal alkoxide include those derived from alcohols including methanol, ethanol, propanol, isopropanol, butanol and isobutanol, and those derived from alkoxy alcohols including methoxyethanol, ethoxyethanol, propoxyethanol, butoxyethanol, pentoxyethanol, heptoxyethanol, methoxypropanol, ethoxypropanol, propoxypropanol, butoxypropanol, pentoxypropanol and heptoxypropanol.

In the invention, if the insulator layer is made of the above-mentioned materials, polarization tends to occur easily in the insulator layer, and the threshold voltage of transistor operation can be reduced. Of the above-mentioned materials, an insulator layer can be formed by silicon nitride such as $Si_3N_4$, SixNy, SiOx (x, y>0) or the like.

Examples of materials for the insulator layer using organic compounds include polyimide, polyamide, polyester, polyacrylate, a photo-curable resin such as a photoradical polymerization resin and a photocationic polymerization resin, a copolymer containing acrylonitrile components, polyvinylphenol, polyvinylalcohol, novolac resin and cyanoethylpullulan.

Other examples thereof include wax, polyethylene, polychloropyrene, polyethylene terephthalate, polyoxymethylene, polyvinyl chloride, polyvinylidene fluoride, polysulfone, polyimidecyanoethyl pullulan, poly(vinylphenol) (PVP), poly(methylmethacrylate) (PMMA), polycarbonate (PC), polystyrene (PS), polyolefin, polyacrylamide, poly (acrylic acid), a novolac resin, a resol resin, polyimide, polyxylylene, and an epoxy resin. In addition to these resins, polymer materials having a high dielectric constant such as pullulan can be used.

A particularly suitable organic compound material or a polymer material for the insulator layer is a material having water repellency. The use of a material having such water repellency makes it possible to control interaction between the insulator layer and the organic semiconductor layer, and makes it possible to enhance the crystallinity of the organic semiconductor layer by utilizing cohesive properties intrinsic to an organic semiconductor, whereby device performance can be improved. A polyparaxylylene derivative described in Yasuda et al., Jpn. J. Appl. Phys. Vol. 42 (2003) pp. 6614-6618 or a compound described in Janos Veres et al., Chem. Mater., Vol. 16 (2004) pp. 4543-4555 can be mentioned as an example of the organic compound.

Figure 4:
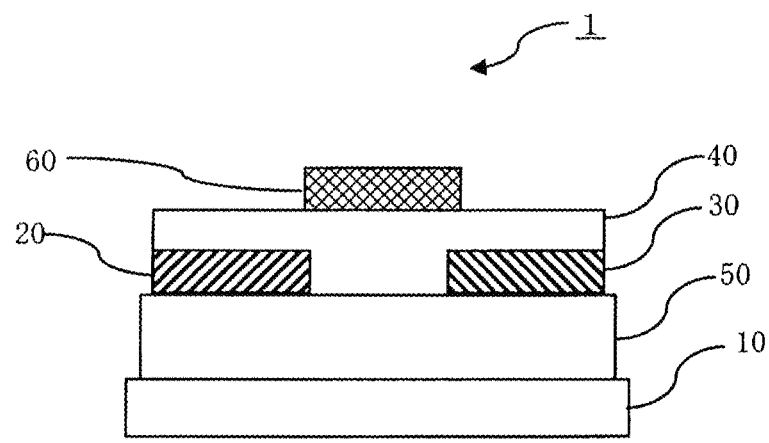
FIG. 4 is a view showing another embodiment of the organic thin film transistor of the invention (device D)

When the top gate structure shown in FIG. 1 and FIG. 4 is used, the use of the above-mentioned organic compound as the material for the insulator layer is an effective method, since it makes it possible to form a film while lessening damage exerted on the organic semiconductor layer.

The insulator layer may be a mixed layer in which the above-mentioned inorganic or organic compound materials are used in combination, and may be a stacked layer composed of these materials. In this case, device performance can also be controlled by mixing or stacking a material having a high dielectric constant and a material having water repellency, according to need.

Further, the insulator layer may be formed of an anodic oxidized film, or this anodic oxidized film may be used as a part of the structure of the insulator layer. Preferably, the anodic oxidized film is subjected to a sealing process. The anodic oxidized film is formed by anodizing a metal, which can be anodized, by a known method. Aluminum or tantalum can be mentioned as a metal which can be anodized. No particular restrictions are imposed on the anodizing method, and a known method can be used. An oxidized film is formed by performing an anodizing process. Any type of solution can be used as the electrolytic solution used for the anodizing process as long as a porous oxidized film can be formed. In general, sulfuric acid, phosphoric acid, oxalic acid, chromic acid, boric acid, sulfamic acid, benzenesulfonic acid, or a mixed acid produced by combining two or more kinds of acids of the above-mentioned acids, or salts of the above-mentioned acids are used. Anodizing process conditions cannot be absolutely specified because they variously change depending on an electrolytic solution to be used. In general, appropriate conditions are an electrolyte concentration of 1 to 80 mass %, an electrolyte temperature of 5 to 70° C., an electric current density of 0.5 to 60 A/cm$^2$, a voltage of 1 to 100 V, and an electrolysis time of 10 seconds to 5 minutes. A preferred anodizing process is to use an aqueous solution of sulfuric acid, phosphoric acid or boric acid as the electrolytic solution and to perform the process by using direct current. Alternating current can also be used instead of direct current. Preferably, the concentration of these acids is 5 to 45 mass %, and the electrolytic process is performed for 20 to 250 seconds under the conditions of an electrolyte temperature of 20 to 50° C. and an electric current density of 0.5 to 20 A/cm$^2$.

As for the thickness of the insulator layer, if the thickness is small, an effective voltage to be applied to the organic semiconductor will be increased, and hence, the driving voltage and threshold voltage of the device itself can be lowered. However, current leakage between the source electrode and the gate electrode may be increased if the thickness is too small. Normally, the thickness of the insulator layer is 1 nm to 5 µm, and, preferably 5 nm to 2 µm, and more preferably 100 nm to 1 µm.

An arbitrary orientation process may be applied between the insulator layer and the organic semiconductor layer. A preferred example thereof is a method of applying a water-repellent process or the like to the surface of the insulator layer to reduce the interaction between the insulator layer and the organic semiconductor layer, thereby improving the crystallinity of the organic semiconductor layer. Specifically, a method in which a silane coupling agent such as octadecyltrichlorosilane and trichloromethylsilazane, or a material for a self-assembled oriented film such as alkanephosphoric acid, alkanesulfonic and alkanecarboxylic acid is brought into contact with the surface of the insulating film in the liquid phase state or the vapor phase state to form a self-assembled film, followed by an appropriate dry process. A method is also preferable in which a film made of, for example, polyimide is formed on the surface of the insulating film as in case of the orientation of liquid crystals, and the surface of the film is subjected to a rubbing process.

Examples of methods employed for forming the insulator layer include dry processes, e.g., the vacuum vapor deposition method, the molecular beam epitaxial growth method, the ion cluster beam method, the low energy ion beam method, the ion plating method, the CVD method, the sputtering method and the atmospheric-pressure plasma method disclosed in JP-A-H11-61406, JP-A-H11-133205, JP-A-2000-121804, JP-A-2000-147209 and JP-A-2000-185362, and wet processes, e.g., the coating method, such as the spray coating method, the spin coating method, the blade coating method, the dip coating method, the casting method, the roll coating method, the bar coating method and the die coating method, and the patterning method such as printing and inkjetting. An adequate process may be used in accordance with materials. For example, as for the wet process, a method of applying and drying a liquid obtained by dispersing fine particles of an inorganic oxide into an arbitrary organic solvent or water by using a dispersion assisting agent, such as a surfactant, as necessary, or the so-called sol-gel method in which an oxide precursor, for example, an alkoxide solution, is applied and dried, are used.

Although the film thickness of the organic semiconductor layer in the organic thin film transistor of the invention is not particularly restricted, it is normally 0.5 nm to 1 µm, and preferably 2 nm to 250 nm. Further, the method for forming the organic semiconductor layer is not particularly restricted and it can be formed by using the above-mentioned materials for the organic semiconductor layer a known method. For example, printing or coating method such as the molecular beam epitaxy method (the MBE method), the vacuum vapor deposition method, the chemical vapor deposition, the dipping method of a solution in which materials are dissolved in a solvent, the spin coating method, the casting method, the bar coat method, the roll coat method, and baking, electro-polymerization, molecular-beam deposition, self-assembly from a solution, and combination thereof. Since the field effect mobility can be improved by improving the crystalline property of the organic semiconductor layer, it is preferable to keep the substrate temperature high when film formation from the vapor phase (deposition, sputtering or the like) is conducted. The substrate temperature is preferably 50 to 250° C., further preferably 70 to 150° C. In order to obtain a high performance device, it is preferable to conduct annealing after film formation irrespective of the film formation method. It is preferable to conduct annealing at a temperature of 50 to 200° C., further preferably 70 to 200° C. The annealing time is preferable 10 minutes to 12 hours, with 1 to 10 hours being further preferable.

No particular restrictions are imposed on the method for forming the organic thin film transistor of the invention, and a known method can be used. It is preferred that a series of device forming steps consisting of substrate mounting, gate electrode formation, carrier injection layer formation, insulator layer formation, organic semiconductor layer formation, source electrode formation, and drain electrode formation be carried out while completely avoiding contact with the atmosphere according to a desired device structure, because device performance can be prevented from being impaired by moisture or oxygen in the atmosphere as a result of contact with the atmosphere. Even when the device must be formed by being unavoidably brought into contact with the atmosphere once, steps subsequent to the step of organic semiconductor layer formation are performed while completely avoiding contact with the atmosphere, and, immediately before the step of organic semiconductor layer formation, a surface on which the organic semiconductor layer is stacked (the surface of the insulator layer, on part of which, the source electrode and the drain electrode are stacked in the case of the device B) is purified and activated by, for example, ultraviolet light irradiation, ultraviolet light/ozone irradiation, oxygen plasma, argon plasma or the like, and then the organic semiconductor layer is stacked thereon. Further, a gas barrier layer may be formed on the entire or part of the outer peripheral surface of the organic transistor device, for example, taking into consideration an influence exerted on the organic semiconductor layer by oxygen or water contained in the atmosphere. Materials normally used in this field can be used for forming the gas barrier layer. Examples of such materials include polyvinyl alcohol, an ethylene-vinyl alcohol copolymer, polyvinyl chloride, polyvinylidene chloride and polychlorotrifluoroethylene. Further, inorganic substances having insulation properties exemplified regarding the above-mentioned insulator layer can also be used.

EXAMPLES

The invention will be described in more detail with reference to the examples and the comparative examples which should not be construed as limiting the scope of the invention.

The molecular weight of polyaniline was determined by the gel permeation chromatography (GPC). Specifically, as the column, TOSOH TSK-GEL GMHHR-H was used. A 0.01 M LiBr/N-methylpyrrolidone solution was used, and measurement was conducted at 60° C. at a flow rate of 0.35 mL/min. As for the sample, 100 µL of a 0.2 g/L solution was poured, and detection was conducted by UV with a wavelength of 260 nm. As the standard, the average molecular weight was calculated by the PS conversion method.

Production Example 1

Production of Conductive Polyanilline (1) Production of Protonated Polyaniline Composite 100 mL of toluene was placed in a 1 L-glass flask equipped with a mechanical stirrer and a dropping funnel. 3.6 g of Aerosol OT (diisooctyl sodium sulfosuccinate, manufactured by Wako pure chemical industries, Ltd.) and 3.74 g of aniline (manufactured by Wako pure chemical industries, Ltd.) were dissolved therein. While stirring this solution, 300 mL of 1N hydrochloric acid was added, and the flask was cooled on ice bath. A solution obtained by dissolving 5.36 g of ammonium persulfate in 100 mL of 1N hydrochloric acid was added dropwise through the dropping funnel to start the polymerization of the aniline. The polymerization reaction was conducted while cooling the flask on ice water bath, and the stirring was stopped after 18 hours. The reaction solution was transferred to a separating funnel, and the water phase was removed from the reaction solution which had been separated into two phases. The toluene organic phase was washed twice with ion-exchanged water, and twice with a 1N hydrochloric acid solution. From a toluene solution containing a desired product, a volatile matter (organic solvent) was distilled off under reduced pressure, whereby a protonated, solid polyaniline composite was obtained.

(2) Molecular Weight and Composition of Polyaniline Composite (2-1) Measurement of Molecular Weight The polyaniline composite obtained in (1) above was again dissolved in toluene, whereby a toluene solution containing the polyaniline composite in an amount of 50 g/L was prepared. By allowing 5 mL of this solution to be in contact with and mixed with a 10 mL of a 1N aqueous sodium hydroxide solution, non-conductive polyaniline which was insoluble in both solutions (the so-called Emeraldine base state) was deposited. This non-conductive polyaniline was filtered off and dried, and the GPC measurement was conducted by using a NMP (N-methylpyrrolidone) solvent. As a result, it was found that the non-conductive polyanilne had a very high molecular weight, i.e. a PS-converted weight-average molecular weight was 614,000 g/mol.

(2-2) Composition Ratio of Polyaniline and Sodium Diisooctylsulfosuccinate

From the ratio of the number of moles of the sulfur atom and the nitrogen atom contained in the polylaniline composite, the doping ratio of the polyaniline composite (composition ratio of the polyaniline and sodium diisoctylsulfosuccinate) can be calculated. Specifically, by using the high-frequency combustion method and the CHN corder method, the number of moles of the sulfur atom (S) and the number of moles of the nitrogen atom (N) in the polyaniline composite were respectively measured. A value obtained by dividing S by N was defined as the doping ratio.

0.25 g of the polyaniline composite obtained in (1) above was dissolved in 4.75 g of toluene and 0.25 g of isopropyl alcohol. To the thus obtained solution, 250 mL of hexane was added, followed by stirring. Thereafter, the mixture was naturally filtered by means of a No. 5C filter paper, and collected solid matters were dried under reduced pressure, whereby polyaniline for the doping ratio measurement was prepared. The thus obtained sample was analyzed by the high-frequency combustion method and the CHN corder method, and the doping ratio was calculated by the above-mentioned procedures. The doping ratio was found to be 0.43.

(3) Production of a Conductive Polyaniline Composition

The polyaniline composite obtained in (1) above was again dissolved in toluene. To 1 mL of a toluene solution containing the polyaniline composite in an amount of 50 g/L, 1 mmol of m-cresol was added, whereby a conductive polyaniline composition (1) having a concentration of m-cresol of about 0.2 mol/L was obtained.

(4) Production of a Conductive Polyaniline Cast

The conductive polyaniline composition obtained in (3) above was applied to a glass substrate in a range of 14 mm×52 mm. The resultant was dried at 80° C. for 30 minutes in the stream of air, whereby a 15 µm-thick conductive coating film was prepared. The intrinsic conductivity was measured by means of a Loresta GP (a resistivity meter by the four probe method manufactured by Mitsubishi Chemical Corporation). The resulting coating film had an intrinsic conductivity of 318 S/cm. The HOMO level of the coating film was measured in the air by means of a photoelectric spectroscopy device (AC-3, manufactured by RIKEN KEIKI Co., Ltd.), and the HOMO level was found to be 4.9 eV.

Example 1

Production of an Organic Thin Film Transistor

A glass substrate was subjected to ultrasonic cleaning in neutral detergent, pure water, acetone and ethanol, each for 30 minutes. Then, the glass substrate was further subjected to ozone cleaning. After that, gold (Au) was deposited in a thickness of 40 nm by sputtering to form a gate electrode. Subsequently, this substrate was mounted in the film-formation part of heating CVD apparatus. On the other hand, 250 mg of a polyparaxylene derivative [polyparaxylene chloride (Parylene)] (diX-C, manufactured by DAISAN KASEI Co., Ltd.) as a raw material for an insulating layer was put in a petri dish and set in the evaporation part. The thermal CVD apparatus was vacuumed using a vacuum pump to reduce the pressure to 5 Pa. After that, the evaporation part was heated to 180° C., the polymerizing part was heated to 680° C., and then the both parts were left for 2 hours. As a result, a 1 µm-thick insulator layer was formed on the gate electrode. The substrate on which the insulator layer was formed was set in a vacuum evaporation apparatus (EX-400, manufactured by ULVAC, Inc.). On the insulator layer, 1,4-bis(4-methylstyryl) benzene (4MSB) was formed at a deposition speed of 0.05 nm/s, thereby to form an organic semiconductor layer having a thickness of 50 nm. Subsequently, on the organic semiconductor layer, the conductive polyaniline composition (I) prepared in Production Example 1 was applied by means of a dispenser, whereby a 200 nm-thick source/drain electrode was formed. At this time, the interval between the source electrode and the drain electrode (channel length L) was 300 µm. Film formation was conducted such that the width of the source electrode and the drain electrode (channel width W) became 5 mm, respectively, whereby an organic thin film transistor shown in FIG. 3 was fabricated.

To the gate electrode of the resulting organic thin film transistor, a gate voltage of 0 to −100V was applied. A voltage was applied between the source electrode and the drain electrode to allow current to flow. In the thus obtained organic thin film transistor, holes were induced in the channel region (between the source electrode and the drain electrode) of the organic semiconductor layer. The transistor was operated as a p-type transistor. As a result, the on/off ratio of current between the source electrode and the drain electrode in the current saturation region was $1.8 \times 10^6$. The field effect mobility μS and the threshold voltage VT of holes of the organic thin film transistor were calculated from the formula (2), and it was found that μS=0.09 cm$^2$/Vs and VT=−17V. From the above-mentioned formula (I), the field effect mobility μL in the linear region was calculated. The value of μL was found to be 0.085 cm$^2$/Vs. Further, for the above-obtained deposition film of 4MSB, the HOMO level was measured by means of a photo-electron spectrometer in air (AC-3, manufactured by RIKEN KEIKI Co., Ltd.), and the HOMO level was found to be 5.6 eV.

Example 2

A conductive coating film was obtained in the same manner as in Production Example 1(4), except that, in Production Example 1(3), the content of m-cresol was changed to 0.2 mmol and a conductive polyaniline composition (2) having a concentration of m-cresol of about 0.9 mol/L was used. By removing the resulting coating film from the glass substrate, a stand-alone type film was obtained. The resulting stand-alone type film had an intrinsic conductivity of 59 S/cm. An organic thin film transistor was fabricated in the same manner as in Example 1 using the conductive polyaniline composition (2). Properties of the resulting organic thin film transistor were measured in the same manner as in Example 1. The results are shown in Table 1.

Example 3

A conductive polyaniline coating film was obtained in the same manner as in Production Example 1(4), except that, in Production Example 1(3), 1 mmol of phenol was used instead of m-cresol and a conductive polyaniline composition (3) having a concentration of phenol was about 0.9 mol/L was used. The resulting coating film had an intrinsic conductivity of 171 S/cm. By using the conductive polyaniline composition (3), an organic thin film transistor was fabricated in the same manner as in Example 1. Properties of the resulting organic thin film transistor were measured in the same manner as in Example 1. The results are shown in Table 1.

Example 4

A conductive coating film was obtained in the same manner as in Production Example 1(4), except that, in Production Example 1(3), 1 mmol of 4-methoxyphenol was used instead of cresol and a conductive polyaniline composition having a concentration of 4-methoxyphenol was about 0.2 mol/L was used. The resulting coating film had an intrinsic conductivity of 48 S/cm. By using the conductive polyaniline composition (4), an organic thin film transistor was fabricated in the same manner as in Example 1. Properties of the resulting organic thin film transistor were measured in the same manner as in Example 1. The results are shown in Table 1.

Example 5

A conductive coating film was obtained in the same manner as in Production Example 1(4), except that, in Production Example 1(3), 4 mmol of 4-methoxyphenol was used instead of cresol and a conductive polyaniline composition having a concentration of 4-methoxyphenol of about 1.0 mol/L was used. The resulting coating film had an intrinsic conductivity of 279 S/cm. By using the conductive polyaniline composition (5), an organic thin film transistor was fabricated in the same manner as in Example 1. Properties of the resulting organic thin film transistor were measured in the same manner as in Example 1. The results are shown in Table 1.

Example 6

A conductive coating film was obtained in the same manner as in Production Example 1(4), except that 1 mmol of 2-naphthol was used instead of cresol in Production Example 1(3) and a conductive polyaniline composition (6) having a concentration of 2-naphthol of about 0.2 mol/L was used. The resulting coating film had an intrinsic conductivity of 122 S/cm. By using the conductive polyaniline composition (6), an organic thin film transistor was fabricated in the same manner as in Example 1. Properties of the resulting organic thin film transistor were measured in the same manner as in Example 1. The results are shown in Table 1.

Example 7

An organic thin film transistor was fabricated in the same manner as in Example 1, except that 3,10-didodecyldibenzo [a,h]anthracene was used as the organic semiconductor forming the organic semiconductor layer. Properties of the resulting organic thin film transistor were measured in the same manner as in Example 1. The results are shown in Table 1.

Figure 5:
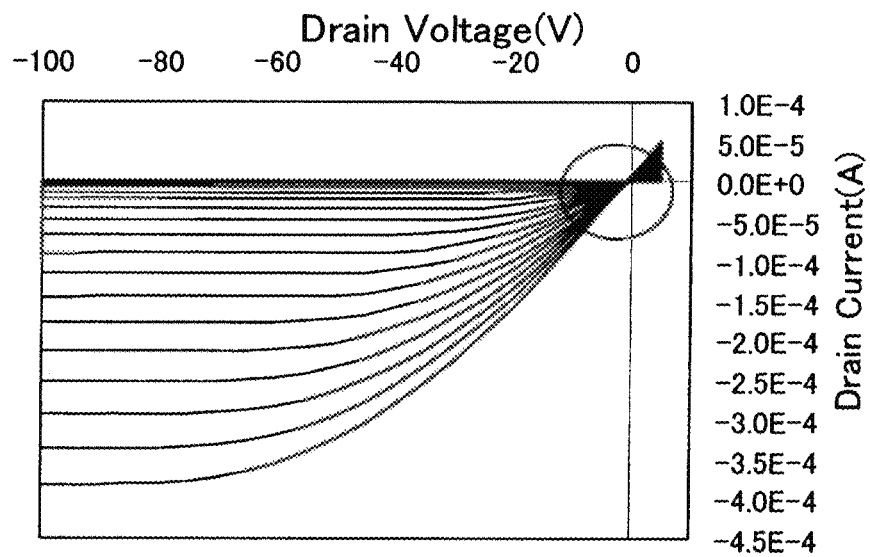
FIG. 5 is a view showing the output curves of the organic thin film transistor of Example 7.
Figure 5:
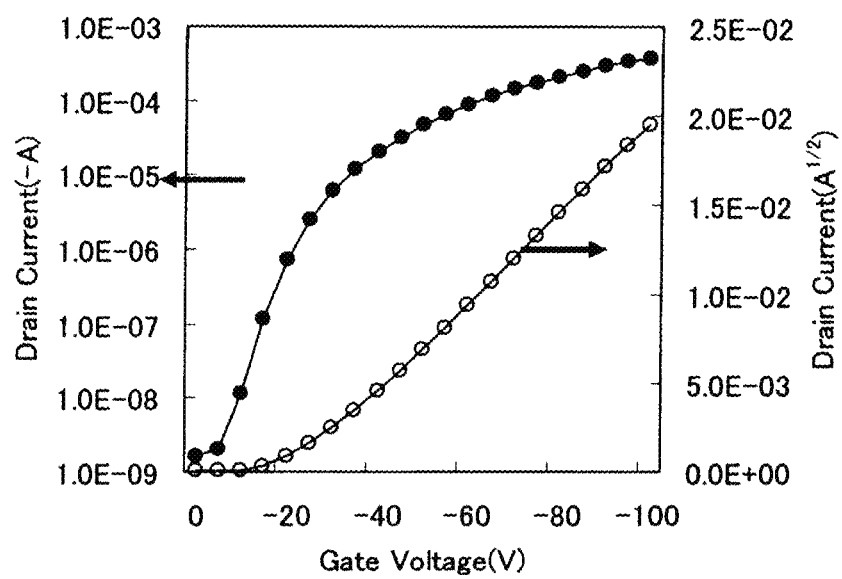

The output curves of the resulting organic thin film transistor are shown in FIG. 5. From FIG. 5, in the region where the drain voltage is near 0V (part encircled by ○), the output curves were linear, showing that the contact resistance was decreased.

The HOMO level of the deposition film of the organic semiconductor was measured similarly in Production Example 1(4), and the HOMO level was found to be 5.7 eV.

Comparative Example 1

In the same manner as in Example 1, as the organic semiconductor layer, film formation was conducted until a film of 4MSB was formed. By forming a film of gold in a thickness of 50 nm through a metal mask, a source electrode and a drain electrode which were not in contact with each other was formed so that the interval (channel length: L) became 300 μm. At this time, the width of the source electrode and the drain electrode (channel width: W) was 5 mm, respectively. In this way, an organic thin film transistor was produced. Properties of the resulting organic thin film transistor were evaluated. The results are shown in Table 1.

Comparative Example 2

In the same manner as in Example 7, as the organic semiconductor layer, film formation was conducted until a film of 3,10-didodecyldibenzo[a,h]anthracene was formed. By forming a film of gold in a thickness of 50 nm through a metal mask, a carrier injection layer and a source electrode and a drain electrode which were not in contact with each other was formed so that the interval (channel length: L) became 300 μm. At this time, the width of the source electrode and the drain electrode (channel width: W) was 5 mm, respectively. In this way, an organic thin film transistor was produced. Properties of the resulting organic thin film transistor were evaluated. The results are shown in Table 1.

Figure 6:
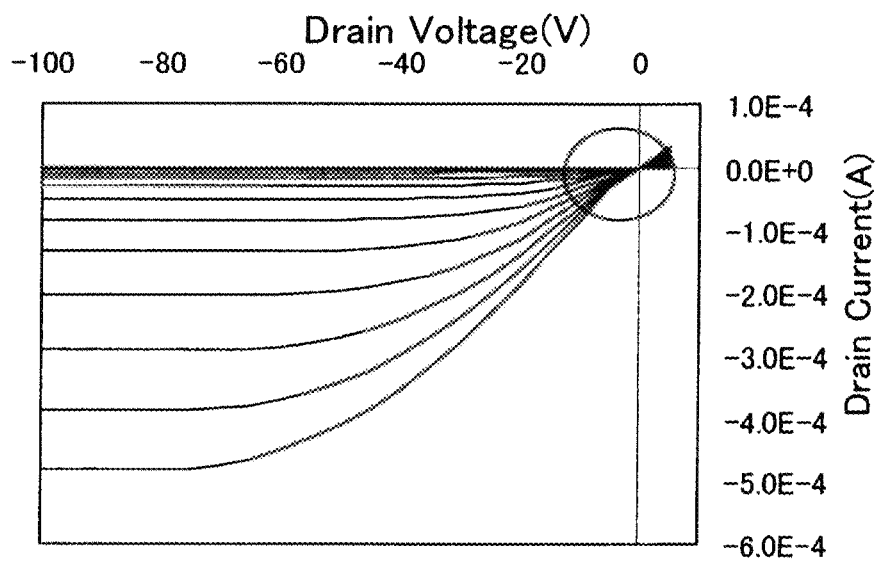
FIG. 6 is a view showing the output curves of the organic thin film transistor of Comparative Example 2.
Figure 6:
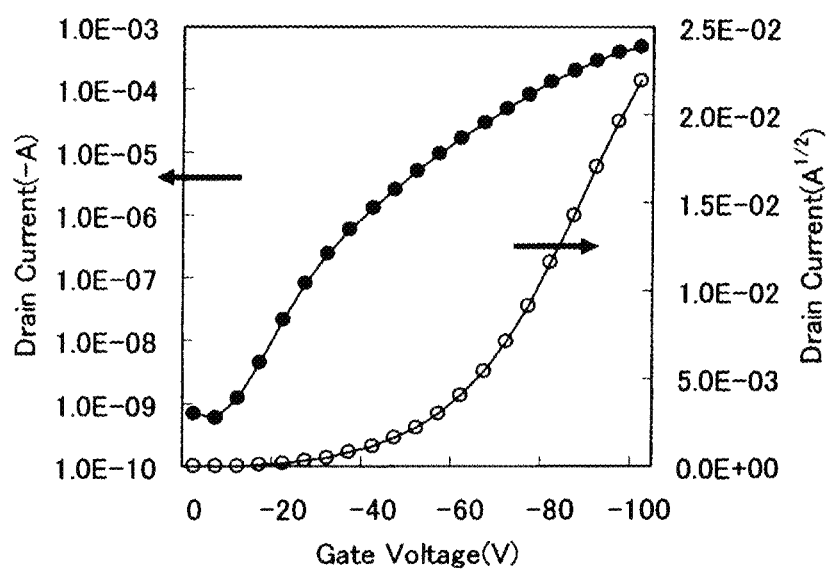

The output curves of the resulting organic thin film transistor are shown in FIG. 6. From FIG. 6, in a region in which the drain voltage is near 0V (a part encircled by ◯), the output curves were bent and deviated from the straight line, showing that the contact resistance was large, deviating form the properties shown by the formula (1).

TABLE 1

|  | Source electrode/Drain electrode | (b) Compound having a phenolic hydroxyl group | Work function of polyaniline composition [eV] | Material for organic semiconductor layer | Properties of saturation region (formula (2)) | | | Properties of non-linear region (formula (1)) | |
|---|---|---|---|---|---|---|---|---|---|
|  |  |  |  |  | Field effect mobility $\mu_s$ [cm²/Vs] | Threshold voltage $V_T$ [V] | On/off ratio | Field effect mobility $\mu_L$ [cm²/Vs] | Bending of the output curve when drain voltage is near 0 V |
| Example 1 | Polyaniline composition (1) | m-cresol | 4.9 | 4MSB | 0.09 | −17.0 | $1.8 \times 10^6$ | 0.085 | None |
| Example 2 | Polyaniline composition (2) | m-cresol | 4.9 | 4MSB | 0.1 | −18.1 | $1.5 \times 10^6$ | 0.1 | None |
| Example 3 | Polyaniline composition (3) | Phenol | 5 | 4MSB | 0.08 | −20.0 | $0.92 \times 10^6$ | 0.08 | None |
| Example 4 | Polyaniline composition (4) | 4-Methoxyphenol | 4.85 | 4MSB | 0.08 | −15.0 | $2.2 \times 10^6$ | 0.08 | None |
| Example 5 | Polyaniline composition (5) | 4-methoxyphenol | 4.85 | 4MSB | 0.07 | −19.0 | $5.2 \times 10^6$ | 0.062 | None |
| Example 6 | Polyaniline composition (6) | 2-naphthol | 5.1 | 4MSB | 0.11 | −13.0 | $4.0 \times 10^6$ | 0.1 | None |
| Example 7 | Polyaniline composition (1) | m-cresol | 4.9 | 3,10-didodecyldibenzo[a,h]anthracene | 8 | −21.9 | $1.9 \times 10^6$ | 7.6 | None |
| Com. Ex. 1 | Au | — | — | 4MSB | 0.065 | −33.0 | $3.1 \times 10^4$ | 0.034 | Occurred |
| Com. Ex. 2 | Au | — | — | 3,10-didodecyldibenzo[a,h]anthracene | 7.5 | −56.6 | $8.2 \times 10^5$ | 1.9 | Occurred |

As is understood from the Examples and the Comparative Examples, the organic thin film transistor of the invention in which a specific conductive polyaniline composition is used in the source electrode and the drain electrode can be driven at a lower driving voltage and has a high mobility.

Industrial Applicability

By using a specific conductive polyaniline composition in at least one of the source electrode and the drain electrode, the organic thin film transistor of the invention can be driven at a low driving voltage, has a high response (driving) speed, and exhibits high performance as a transistor.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. An organic thin film transistor comprising at least a gate electrode, a source electrode, a drain electrode, an insulator layer and an organic semiconductor layer, at least one of the source electrode and the drain electrode comprising a conductive polyaniline composition comprising the following components (a) and (b):

(a) a substituted or unsubstituted polyaniline composite which is protonated by an organic protonic acid or its salts represented by the following formula (I):

$$M(XCR^4(CR^5{}_2COOR^6)COOR^7)_p \qquad (I)$$

wherein

M is a hydrogen atom, or an organic or inorganic free radical;

X is an acidic group;

$R^4$ and $R^5$ are independently a hydrogen atom, a hydrocarbon group or a $R^8{}_3Si—$ group wherein $R^8$ is a hydrocarbon group and three $R^8$s may be the same or different;

$R^6$ and $R^7$ are independently a hydrocarbon group having 4 or more carbon atoms which may have a substituent or a $—(R^9O)q\text{-}R^{10}$ group wherein $R^9$ is a hydrocarbon group or a silylene group, $R^{10}$ is a hydrogen atom, a hydrocarbon group or a $R^{11}{}_3Si\text{-}$ group (wherein $R^{11}$ is a hydrocarbon group and three $R^{11}$s may be the same or different) and q is an integer of 1 or more; and p is a valence of M; and (b) A compound having a phenolic hydroxyl group.

2. The organic thin film transistor according to claim 1, wherein the organic protonic acid or its salts represented by the formula (I) is a sulfosuccinic acid derivative represented by the following formula (II):

$$M(O_3SCH(CH_2COOR^{12})COOR^{13})_m \qquad (II)$$

wherein M is a hydrogen atom, or an inorganic free radical;

$R^{12}$ and $R^{13}$ are independently a hydrocarbon group having 4 or more carbon atoms which may have a substituent or a $—(R^{14}O)r\text{-}R^{15}$ group wherein $R^{14}$ is a hydrocarbon group or a silylene group, $R^{15}$ is a hydrogen atom, a hydrocarbon group or a $R^{16}{}_3Si—$ group (wherein $R^{16}$ is a hydrocarbon group and three $R^{16}$s may be the same or different) and r is an integer of 1 or more; and m is the valence of M.

3. The organic thin film transistor according to claim 1, wherein the (b) compound having a phenolic hydroxyl group is a compound represented by the following formula (A):

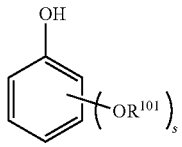

(A)

wherein s is an integer of 0 to 5;
R$^{101}$ is a hydrogen atom, an alkyl group having 1 to 20 carbon atoms, an alkenyl group having 2 to 20 carbon atoms, a cycloalkyl group having 3 to 10 ring carbon atoms, an aryl group having 6 to 20 ring carbon atoms, an alkylaryl group having 7 to 20 carbon atoms or an arylalkyl group having 7 to 20 carbon atoms; and when s is 2 or more, plural R$^{101}$s may be the same or different.

4. The organic thin film transistor according to claim 1, wherein the (b) compound having a phenolic hydroxyl group is a compound represented by the following formula (B):

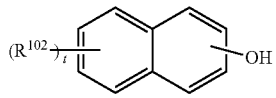

(B)

wherein t is an integer of 0 to 7;
R$^{102}$ is an alkyl group having 1 to 20 carbon atoms, an alkenyl group having 2 to 20 carbon atoms, an alkylthio group having 1 to 20 carbon atoms, a cycloalkyl group having 3 to 10 ring carbon atoms, an aryl group having 6 to 20 ring carbon atoms, an alkylaryl group having 7 to 20 carbon atoms or an aryl alkyl group having 7 to 20 carbon atoms; and when t is 2 or more, plural R$^{102}$s may be the same or different.

5. The organic thin film transistor according to claim 1, wherein the (b) compound having a phenolic hydroxyl group is a compound represented by the following formula (C):

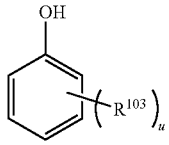

(C)

wherein u is an integer of 1 to 5;
R$^{103}$ is a halogen atom, an alkyl group having 1 to 20 carbon atoms, an alkenyl group having 2 to 20 carbon atoms, an alkylthio group having 1 to 20 carbon atoms, a cycloalkyl group having 3 to 10 ring carbon atoms, an aryl group having 6 to 20 ring carbon atoms, an alkylaryl group having 7 to 20 carbon atoms, an arylalkyl group having 7 to 20 carbon atoms or a COOH group; and when u is 2 or more, plural R$^{103}$s may be the same or different.

6. The organic thin film transistor according to claim 1, wherein the (b) compound having a phenolic hydroxyl group is a compound represented by the following formula (D):

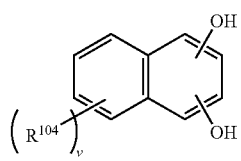

(D)

wherein v is an integer of 0 to 6;
R$^{104}$ is a hydrocarbon group, a hetero-containing hydrocarbon group, a halogen atom, a carboxyl group, an amino group, an SH group, a sulfonic acid group or a hydroxyl group; and when v is 2 or more, plural R$^{104}$s may be the same or differerent.

7. The organic thin film transistor according to claim 1, wherein the (b) compound having a phenolic hydroxyl group is one or more selected from phenol, o-, m- or p-cresol, cathecol, resorcinol, chlorophenol, salicyclic acid, hydroxybenzoic acid, hydroxynaphthalene, a phenol resin, polyphenol and poly(hydroxystyrene).

8. The organic thin film transistor according to claim 1, wherein the HOMO level of the organic semiconductor layer is larger than the HOMO level of Au.

9. The organic thin film transistor according to claim 1, wherein the organic semiconductor layer comprises one or more compounds selected from
a compound having 4 or less linearly fused aromatic rings, which may have a substituent,
a compound represented by $C_6H_5$—CH=CH—$C_6H_5$ and 5 or less oligomers of
the compound, which may have a substituent,
a fused oligothiophene,
a heteroaromatic compound and a fused aromatic ring compound having the heteroaromatic compound as a matrix, which may have a substituent, and
a nonbenzenoid aromatic compound and a fused aromatic ring compound using the nonbenzenoid aromatic compound as a matrix, which has 4 or less linearly fused aromatic rings, which may have a substituent.

10. The organic thin film transistor according to claim 1, wherein the organic semiconductor layer comprises one or more compounds selected from picene which may have a substituent, chrysene which may have a substituent, pyrene which may have a substituent, benzopyrene which may have a substituent, corannulene which may have a substituent ovalene which may have a substituent, and dibenzoanthracene which may have a substituent.

* * * * *